United States Patent
Sugita et al.

(10) Patent No.: US 9,901,009 B2
(45) Date of Patent: Feb. 20, 2018

(54) SEMICONDUCTOR MEMORY DEVICE

(71) Applicant: Toshiba Memory Corporation, Minato-ku, Tokyo (JP)

(72) Inventors: Masato Sugita, Yokohama Kanagawa (JP); Masayasu Kawase, Yokohama Kanagawa (JP)

(73) Assignee: Toshiba Memory Corporation, Tokyo (JP)

(*) Notice: Subject to any disclaimer, the term of this patent is extended or adjusted under 35 U.S.C. 154(b) by 206 days.

(21) Appl. No.: 14/852,228

(22) Filed: Sep. 11, 2015

(65) Prior Publication Data

US 2016/0270251 A1   Sep. 15, 2016

Related U.S. Application Data

(60) Provisional application No. 62/131,210, filed on Mar. 10, 2015.

(51) Int. Cl.
*H05K 7/20* (2006.01)
*G06F 1/20* (2006.01)

(52) U.S. Cl.
CPC .............. *H05K 7/205* (2013.01); *G06F 1/20* (2013.01); *H05K 7/20454* (2013.01)

(58) Field of Classification Search
None
See application file for complete search history.

(56) References Cited

U.S. PATENT DOCUMENTS

| | | | | |
|---|---|---|---|---|
| 5,396,403 A | * | 3/1995 | Patel | H01L 23/433 257/713 |
| 5,956,576 A | * | 9/1999 | Toy | H01L 23/10 257/704 |
| 6,365,964 B1 | * | 4/2002 | Koors | H01L 23/3675 257/707 |
| 6,407,922 B1 | * | 6/2002 | Eckblad | B82Y 10/00 165/185 |
| 6,700,195 B1 | * | 3/2004 | Mandel | H01L 23/40 257/706 |

(Continued)

FOREIGN PATENT DOCUMENTS

| | | |
|---|---|---|
| JP | 2007-030837 A | 2/2007 |
| JP | 2009-544158 A | 12/2009 |

(Continued)

*Primary Examiner* — Courtney Smith
(74) *Attorney, Agent, or Firm* — White & Case LLP

(57) ABSTRACT

According to one embodiment, a semiconductor memory device includes a case, a first substrate, an element, and a first heat conduction member. The first substrate is provided in the case and includes a first face. The element is provided on the first face. The first heat conduction member is disposed at least between the element and the case. The element includes a second substrate, a control unit, and a storage unit. The second substrate includes a second face attached to the first face and a third face located opposite to the second face. The control unit and the storage unit are provided on the third face. The first heat conduction member covers the third face and the control unit and is disposed in a state in which the first heat conduction member is held between and compressed by the third face, the control unit, and the case.

12 Claims, 11 Drawing Sheets

(56) References Cited

U.S. PATENT DOCUMENTS

| | | | | |
|---|---|---|---|---|
| 6,998,706 | B2* | 2/2006 | Lawlyes | H01L 21/563 257/712 |
| 7,091,063 | B2* | 8/2006 | Sur | H01L 23/42 257/E23.087 |
| 7,239,517 | B2* | 7/2007 | Fitzgerald | H01L 23/04 257/706 |
| 7,629,684 | B2* | 12/2009 | Alcoe | H01L 23/3735 257/706 |
| 8,149,583 | B2 | 4/2012 | Ishii | |
| 8,587,945 | B1 | 11/2013 | Hartmann et al. | |
| 8,787,022 | B2* | 7/2014 | Moriai | G06F 1/20 174/260 |
| 9,117,792 | B2* | 8/2015 | Yang | H01L 23/36 |
| 2008/0012103 | A1 | 1/2008 | Foster et al. | |
| 2011/0013365 | A1* | 1/2011 | Oota | B62D 5/0406 361/707 |
| 2012/0250274 | A1 | 10/2012 | Ukita et al. | |
| 2014/0146461 | A1 | 5/2014 | Choi et al. | |

FOREIGN PATENT DOCUMENTS

| | | |
|---|---|---|
| JP | 2010-171030 A | 8/2010 |
| JP | 2011-134138 A | 7/2011 |
| JP | 2011-170912 A | 9/2011 |
| JP | 4806079 B2 | 11/2011 |
| JP | 2012-216642 A | 11/2012 |
| JP | 2014-049536 A | 3/2014 |

* cited by examiner

SEMICONDUCTOR MEMORY DEVICE

CROSS-REFERENCE TO RELATED APPLICATIONS

This application is based upon and claims the benefit of priority from U.S. Provisional Application No. 62/131,210, filed on Mar. 10, 2015; the entire contents of which are incorporated herein by reference.

FIELD

Embodiments described herein relate generally to a semiconductor memory device.

BACKGROUND

Conventionally, a semiconductor memory device including a heat dissipation structure is known.

The amount of heat generation from a semiconductor component tends to increase as the performance of recent semiconductor devices improves, for example, as the processing speed of recent semiconductor devices increases. Therefore, it is meaningful if a semiconductor memory device is provided with a more efficient heat dissipation structure.

DETAILED DESCRIPTION

Figure 1:
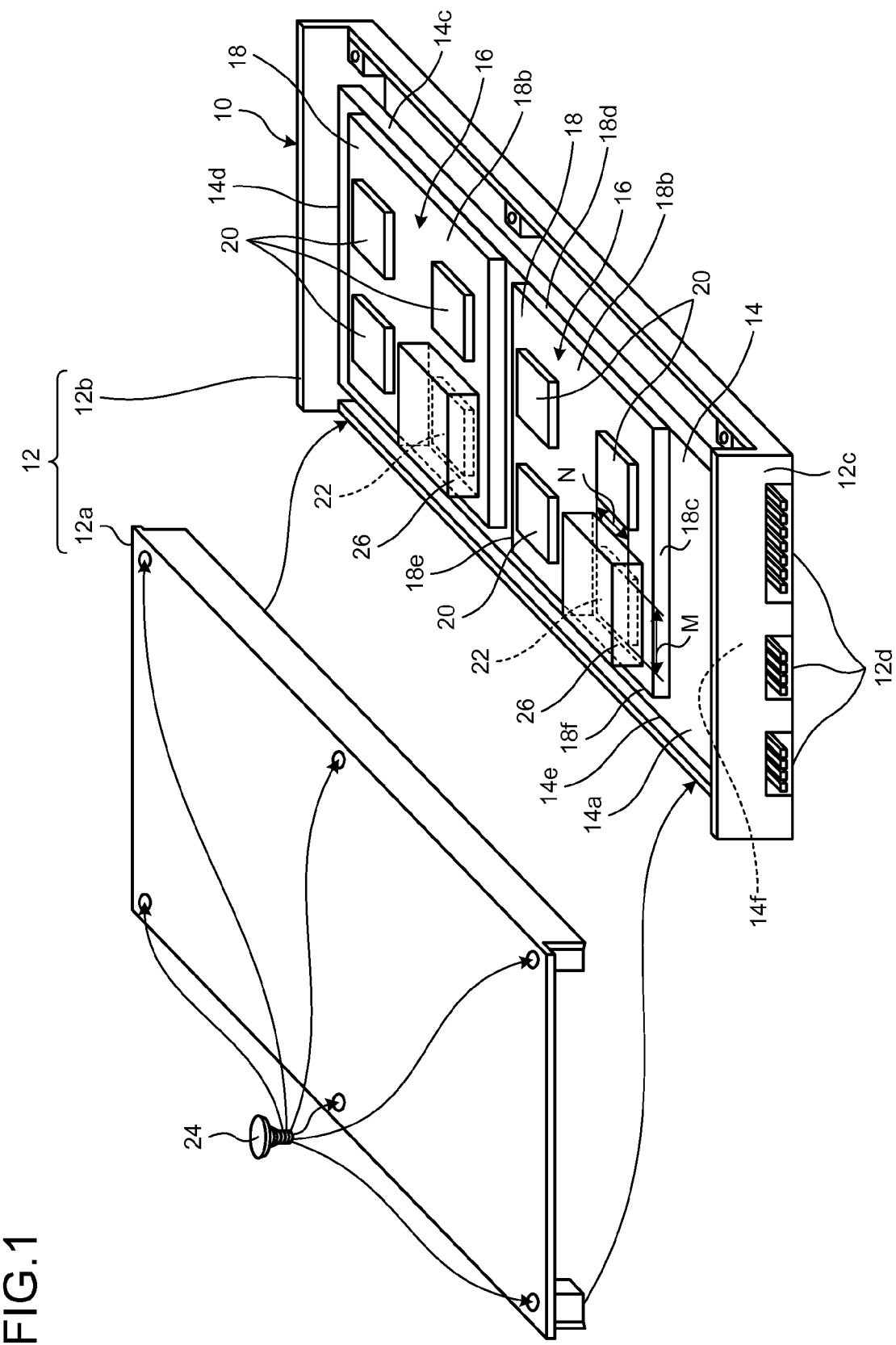
FIG. 1 is a perspective view illustrating an example of a semiconductor memory device according to a first embodiment.

In general, according to one embodiment, a semiconductor memory device comprises a case, a first substrate, an element, and a first heat conduction member. The first substrate is provided in the case and includes a first face. The element is provided on the first face. The first heat conduction member is disposed at least between the element and the case. The element includes a second substrate, a control unit, and a storage unit. The second substrate includes a second face attached to the first face and a third face located opposite to the second face. The control unit and the storage unit are provided on the third face. The first heat conduction member covers the third face and the control unit and is disposed in a state in which the first heat conduction member is held between and compressed by the third face, the control unit, and the case.

Hereinafter, the semiconductor memory device according to embodiments will be described with reference to the drawings. The present invention is not limited to the embodiments.

The same components are included in a plurality of exemplary embodiments and modified examples described below. Therefore, in the description below, the same reference numerals are given to the same components and redundant description is omitted.

First Embodiment

A semiconductor memory device 10 according to the present embodiment is, for example, an SSD (Solid State Drive) device and a large-capacity data storage device using a non-volatile semiconductor memory such as a NAND-type flash memory. As an example, the semiconductor memory device 10 includes a case 12 (housing, package, cover), and a first substrate 14 (Printed Wiring Board: PWB, raw substrate, mother board) is fixed inside the case 12. The first substrate 14 includes at least one element 16 (semiconductor component, electronic component, package component). The element 16 includes a second substrate 18 (PWB, raw substrate, bare board), at least one storage unit 20 (first electronic component, storage chip, NAND-type flash memory chip, Si chip, die) provided on the second substrate 18, and a control unit 22 (second electronic component, control chip, controller, Si chip, die) that controls the storage unit 20. The element 16 forms a so-called one package SSD, which can function as a storage device by itself. The element 16 is a so-called "bare chip" where the storage unit 20 and the control unit 22 are not covered by resin. In addition, the bare chip represents that an electronic component is not covered by a resin member having an impact resistance such that, for example, a radiant heat is disturbed. For example, an electronic component covered with a thin film which does not disturb a radiant heat of the element 16 and have lower impact resistance may be regarded as the bare chip. Such thin film may be provided on the side of a first heat conduction member 26 described below, on which the first heat conduction member 26 faces the element 16. It is possible to reduce the thickness of the element 16 and contribute to reducing the size (reducing the thickness) of the element 16 by flip-chip mounting the control unit 22 and the storage unit 20 on the second substrate 18. Further, it is possible to contribute to reducing the size (reducing the thickness) of the semiconductor memory device 10 on which the element 16 is mounted. In the case of the semiconductor memory device 10 illustrated in FIG. 1, the storage capacity of the entire semiconductor memory device 10 is increased by providing a plurality of elements 16 on the first substrate 14 fixed inside the case 12. FIG. 1 illustrates an example in which the first substrate 14 includes two elements 16. However, the number of elements 16 can be appropriately selected according to the storage capacity required for the semiconductor memory device 10. For example, the number of elements 16 may be one or three or more.

The case 12 includes, for example, a first cover 12*a* (upper cover, lid, upper housing) and a second cover 12*b* (lower cover, case main body, lower housing). The first cover 12*a* is combined with the second cover 12*b* in a state in which the first substrate 14 is fixed to a housing region of the second cover 12*b* and is integrated together by fastening members 24 (screws, bolts, clips). An external force applied to the first substrate 14 and the element 16 is reduced by covering the first substrate 14 and the element 16 (the second substrate 18, the storage unit 20, the control unit 22) by the case 12. In other words, it is possible to improve protective performance of the semiconductor memory device 10 and to improve dust-proof performance. In the case of FIG. 1, for example, six screws are illustrated as the fastening members 24. However, the number of fastening members 24 can be appropriately changed. For example, when the first cover 12*a* and the second cover 12*b* include coupling portions engaging with each other, the first cover 12*a* and the second cover 12*b* may be integrated together by one or two screws so as to maintain the coupling state of the coupling portions.

In the case of the semiconductor memory device 10, for example, case connectors 12*d*, which are electrically connected to an apparatus (not illustrated) to which the semiconductor memory device 10 is connected, for inputting and outputting data and receiving power supply are provided on an outer face 12*c* of the second cover 12*b*. Although not illustrated in FIG. 1, internal connectors electrically connected to the case connectors 12*d* are provided to the first substrate 14. The case connectors 12*d* can be appropriately changed according to the usage of the semiconductor memory device 10. For example, when the semiconductor memory device 10 is a built-in type device connected to a mother board or the like in a computer, the case connectors 12*d* (pin connectors) having a plurality of pins as illustrated in FIG. 1 can be provided. When the semiconductor memory device 10 is an external type device that is externally connected to a computer, a universal serial bus (USB) and a power supply terminal can be provided instead of the case connectors 12*d*.

In the first embodiment, the control unit 22 is thermally connected (contacted, closely attached) to a first heat conduction member 26, and heat generated in the control unit 22 is transferred to the first cover 12*a* and dissipated. The details of the first heat conduction member 26 will be described later.

Figure 2:
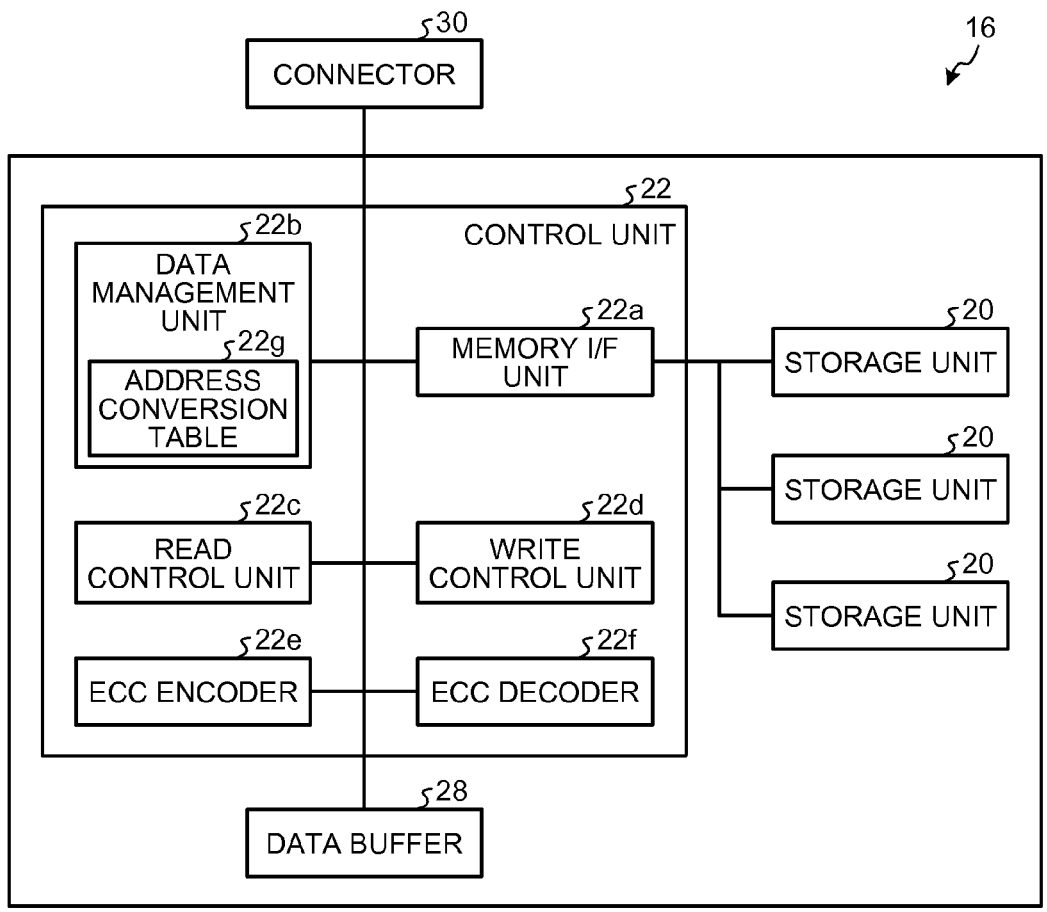
FIG. 2 is a schematic functional block diagram of an element included in the semiconductor memory device of FIG. 1.

FIG. 2 is a schematic functional block diagram of the element 16 included in the semiconductor memory device 10 illustrated in FIG. 1. The storage unit 20 is a non-volatile memory and, for example, is a NAND-type flash memory. The storage unit 20 is not limited to the NAND-type flash memory, but may be RERAM (resistance random access memory) or FERAM (ferroelectric random access memory). The storage unit 20 stores user data transmitted from an external device (host device) of the semiconductor memory device 10 and system data and the like used only inside the element 16. A plurality of storage units 20 are arranged and fixed on the second substrate 18. In the case of FIG. 1, as an example, three storage units 20 are fixed on one second substrate 18. The number of storage units 20 fixed on the second substrate 18 can be changed according to the storage capacity required for the semiconductor memory device 10, so that the number may be one or two. Alternatively, the number may be four or more. Each storage unit 20 can store binary data or multi-value data.

A data buffer 28 temporarily stores data. The data buffer 28 is, for example, DRAM (dynamic random access memory). The data buffer 28 is not limited to DRAM, but may be SRAM (static random access memory) and the like. The data buffer 28 may be provided independently from the control unit 22 or may be mounted inside the control unit 22 as a built-in memory.

The control unit 22 controls the storage unit 20. The function of the control unit 22 can be realized by, for example, a processor, hardware, or the like, which executes firmware stored in ROM (read only memory) included in the storage unit 20 or the control unit 22. The control unit 22 reads data from the storage unit 20 and writes data to the storage unit 20 according to a command from the host device.

The control unit 22 includes a memory interface unit 22*a* (memory I/F unit), a data management unit 22*b*, a read control unit 22*c*, a write control unit 22*d*, an ECC encoder 22*e*, an ECC decoder 22*f*, and the like.

The memory interface unit 22*a* writes a code word inputted from the ECC encoder 22*e* to the storage unit 20 according to control of the write control unit 22*d* and the like. The memory interface unit 22*a* reads a code word from the storage unit 20 according to control of the read control unit 22*c* and the like and transfers the code word to the ECC decoder 22*f*.

The data management unit 22*b* manages where to store data in the storage unit 20. The data management unit 22*b* includes an address conversion table 22*g* which associates a logical address given from the host device with a physical position on the storage unit 20 and performs garbage collection according to usages of blocks on the storage unit 20.

The read control unit 22*c* performs processing for reading data from the storage unit 20 according to a command notified from the host device through an internal connector 30. Specifically, the read control unit 22*c* acquires a physical position on the storage unit 20 corresponding to a logical address of read data from the data management unit 22b and notifies the memory interface unit 22a of the physical position. The read data is transmitted to the host device through the ECC decoder 22f, the data buffer 28, and the like.

The write control unit 22d performs processing for writing data to the storage unit 20 according to a command notified from the host device through the internal connector 30. Specifically, the write control unit 22d acquires a physical position on the storage unit 20 to which data should be written from the data management unit 22b and outputs the physical position and the code word outputted from the ECC encoder 22e to the memory interface unit 22a.

The ECC encoder 22e encodes data held by the data buffer 28 and generates a code word including the data and a redundant portion (parity). The ECC decoder 22f acquires the code word read from the storage unit 20 from the memory interface unit 22a and decodes the acquired code word. If the ECC decoder 22f fails to correct an error when decoding the code word, the ECC decoder 22f notifies the read control unit 22c of a read error.

Figure 3:
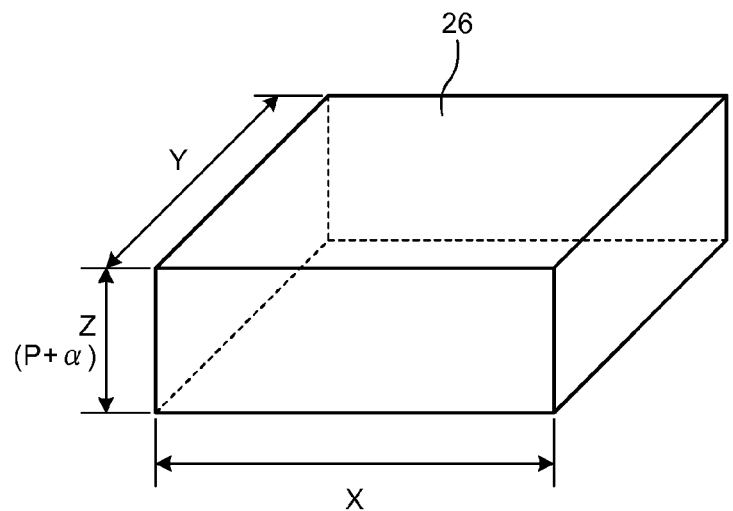
FIG. 3 is a perspective view illustrating an example of a heat conduction member used for the semiconductor memory device according to the first embodiment.

By the way, as the frequency used by the control unit 22 increases, the amount of heat generation in the control unit 22 increases, and the control unit 22 and components around the control unit 22 may be heated. Therefore, if the heat dissipation of the control unit 22 can be effectively performed, it is possible to reduce degradation of function and reduction of lifetime of the control unit 22 and the storage unit 20 adjacent to the control unit 22 due to heat. Therefore, in the semiconductor memory device 10 according to the present embodiment, the first heat conduction member 26 is provided to the control unit 22. The first heat conduction member 26 is formed of a material having flexibility (softness). As illustrated in FIG. 3, the first heat conduction member 26 is formed into, for example, a block shape (rectangular parallelepiped, cube) by using, for example, a synthetic resin material (silicone rubber, elastomer, flexible resin). As illustrated in FIG. 1, the first heat conduction member 26 is disposed between the control unit 22 and the first cover 12a. When the first cover 12a and the second cover 12b are fastened together, the first heat conduction member 26 is pressed against the control unit 22 by the first cover 12a and compressed. As a result, the first heat conduction member 26 is deformed and closely attached to the control unit 22 and is also closely attached to the first cover 12a. Then, the first heat conduction member 26 can efficiently transport the heat generated in the control unit 22 to the first cover 12a and dissipate the heat through the first cover 12a. The first heat conduction member 26 may include a filler such as carbon to improve the heat conductivity.

A portion of the first heat conduction member 26 which comes into contact with the control unit 22 is flat. For example, a case is considered in which the portion of the first heat conduction member 26 which comes into contact with the control unit 22 includes a depressed portion having a concave shape into which the control unit 22 fits. When the control unit 22 fits into the depressed portion, air may remain between the depressed portion and the control unit 22. On the other hand, a case is considered in which the portion of the first heat conduction member 26 which comes into contact with the control unit 22 is flat as in the present embodiment. In this case, when the control unit 22 and the first heat conduction member 26 come into contact with each other, air is difficult to remain between the control unit 22 and the first heat conduction member 26. The first heat conduction member 26 is compressed in this state, so that air is more difficult to remain at the contact face than in a case in which the depressed portion is provided. As a result, it is reduced that the heat conductivity degrades when the first heat conduction member 26 comes into contact with the control unit 22.

Figure 4:
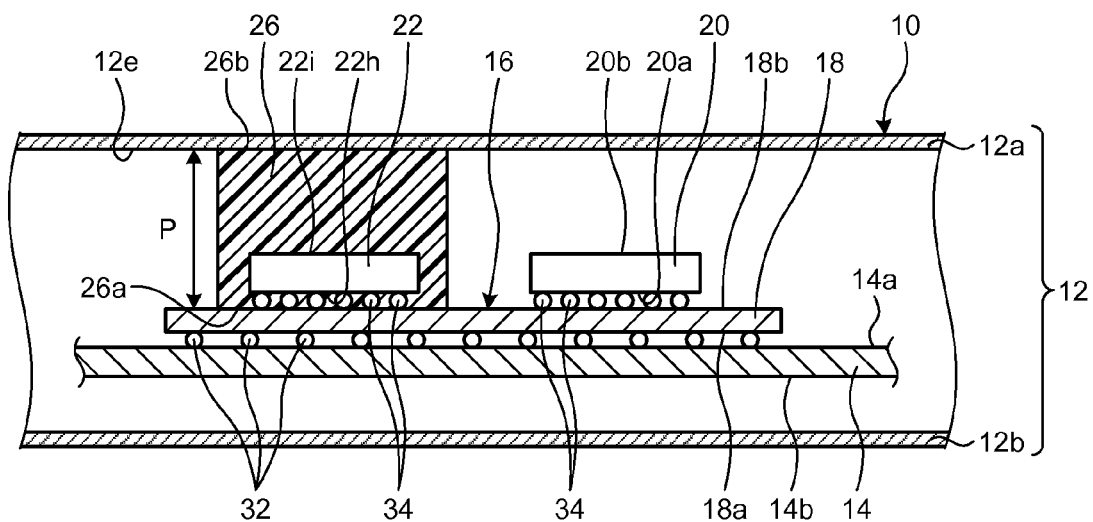
FIG. 4 is a cross-sectional view illustrating an example of the semiconductor memory device according to the first embodiment.

FIG. 4 is a cross-sectional view illustrating an example of the semiconductor memory device 10 according to the first embodiment. FIG. 4 is a cross-sectional view of the semiconductor memory device 10 in which the element 16 is enlarged. As illustrated in FIGS. 4 and 1, the first substrate 14 housed in the case 12 is a flat plate-shaped component including a first face 14a (first front face, mounting face, first substrate face, upper face), a back face 14b (lower face, back face, bottom face) opposite to the first face 14a, and side faces 14c, 14d, 14e, and 14f. Although not illustrated in FIG. 4, the first substrate 14 has a multi-layer structure formed by stacking synthetic resin layers and, for example, has an eight-layer structure. Wiring patterns having various shapes are formed on the face of each layer. For example, a signal layer in which signals are transmitted and received, a ground layer, and a power supply layer are formed. The number of layers of the first substrate 14 is not limited to eight. The types of wiring patterns in each layer can be appropriately changed. For example, different types of wiring patterns may be present in the same layer or there may be a layer including no wiring pattern. In another embodiment, the first substrate 14 may be a single-sided board (one-layer substrate) or a double-sided board (two-layer substrate). When the first substrate 14 is a single-sided board, a ground pattern, a signal pattern, a power supply patter, and the like are formed on the first face 14a. When the first substrate 14 is a double-sided board, the ground pattern, the signal pattern, the power supply pattern, and the like are appropriately separated to the first face 14a and the back face 14b and formed. The side face 14f of the first substrate 14 includes the internal connector 30 (interface, SATA (Serial ATA), plug, see FIG. 2) that is connected to the case connector 12d. The signal layer, the ground layer, the power supply layer, and the like (not illustrated in the drawings) formed on an internal layer of the first substrate 14 are electrically connected to a particular terminal pin of the internal connector 30 and further connected to the case connector 12d.

The first face 14a of the first substrate 14 includes the element 16 that forms one package SSD. As illustrated in FIG. 4, the element 16 includes the second substrate 18 (package substrate, BGA substrate), the control unit 22, and the storage unit 20. As described above, the element 16 is a bare chip semiconductor in which a bare chip that does not include a covering portion (mold, reinforcing member, cover) that covers the control unit 22 and the storage unit 20 is mounted on the second substrate 18. The element 16 is electrically connected and fixed to the first face 14a of the first substrate 14 through bumps 32 (solder bumps).

The second substrate 18 includes a second face 18a (lower face, back face, bottom face) attached to the first face 14a and a third face 18b (third front face, mounting face, third substrate face, upper face, front face, top face) located opposite to the second face 18a. As illustrated in FIG. 1, the second substrate 18 is a flat plate-shaped component including side faces 18c, 18d, 18e, and 18f. Although not illustrated in the drawings, the second substrate 18 has a multi-layer structure formed by stacking synthetic resin layers in the same manner as the first substrate 14. Wiring patterns having various shapes are formed on the face of each layer of the second substrate 18. For example, a signal layer in which signals are transmitted and received, a ground layer, and a power supply layer are formed.

As illustrated in FIG. 1, the control unit 22, which is a bare chip, is, for example, a flat rectangular parallelepiped component and includes a fourth face 22h (lower face, back face, bottom face) where bumps 34 (solder bumps) for connecting with the third face 18b are formed and a fifth face 22i (upper face, front face, top face) opposite to the fourth face 22h. As illustrated in FIG. 1, the storage unit 20, which is also a bare chip component, is, for example, a flat rectangular parallelepiped component and includes a sixth face 20a (lower face, back face, bottom face) where bumps 34 for connecting with the third face 18b are formed and a seventh face 20b (upper face, front face, top face) opposite to the sixth face 20a. The control unit 22 and the storage unit 20 are electrically and mechanically connected to the third face 18b of the second substrate 18 through the bumps 34 by, for example, flip-chip mounting. As illustrated in FIG. 1, the control unit 22 is arranged at a position close to a corner where the side face 18c and the side face 18f intersect with each other on the third face 18b. The three storage units 20 are respectively arranged at a position close to a corner where the side face 18c and the side face 18d intersect with each other, a position close to a corner where the side face 18d and the side face 18e intersect with each other, and a position close to a corner where the side face 18e and the side face 18f intersect with each other. The elements 16 arranged on the first face 14a of the first substrate 14 are arranged so that the control units 22 are not adjacent to each other as illustrated in FIG. 1. The elements 16 are arranged so that the control units 22 are not adjacent to each other in this manner, so that the heat transported through by the first heat conduction members 26 that are respectively in contact with the control units 22 is dispersed on the first cover 12a. As a result, it is possible to improve the heat dissipation efficiency from the first cover 12a.

As illustrated in FIGS. 1 and 4, the first heat conduction member 26 is arranged so as to cover the control unit 22 and a region on the third face 18b around the control unit 22. Further, the first heat conduction member 26 is disposed in a state in which the first heat conduction member 26 is held between and compressed by the third face 18b, the control unit 22, and the case 12. The first heat conduction member 26 includes an eighth face 26a, which is in contact with at least the fifth face 22i of the control unit 22 and the third face 18b, and a ninth face 26b which is in contact with a first wall 12e of the first cover 12a.

In the case of FIG. 4, the area of the eighth face 26a of the first heat conduction member 26 (X*Y in FIG. 3) is greater than the area of the fifth face 22i of the control unit 22 (M*N in FIG. 1). Further, the thickness of the first heat conduction member 26 in a free state in which the first heat conduction member 26 is not held between the third face 18b, the control unit 22, and the first cover 12a (the case) (the dimension in the thickness direction (the separate distance between the eighth face 26a and the ninth face 26b when the eighth face 26a and the ninth face 26b do not contact with an other object), the dimension in the held direction, Z in FIG. 3) is greater than a distance P between the first wall 12e of the first cover 12a and the third face 18b of the second substrate 18 when the first substrate 14 to which the elements 16 are fixed is fixed to the second cover 12b and the first cover 12a is fixed to the second cover 12b by the fastening members 24 (the dimension of the first heat conduction member 26 in the thickness direction (the held direction) when the first heat conduction member 26 is held between the third face 18b, the control unit 22, and the first cover 12a) by a dimension a to be compressed (Z=P+α). In other words, the first heat conduction member 26 can shrink by the flexibility of itself. Further, a pressing force is generated with respect to the first heat conduction member 26 when the first heat conduction member 26 is held between the first cover 12a and the second substrate 18 (the control unit 22). If the pressing force with respect to the first heat conduction member 26 is released, the first heat conduction member 26 returns to the original dimension (Z=P+α) by its own restoring force. It is possible to appropriately select the dimension a to be compressed according to the distance P by measuring in advance the deformation ratio when the first heat conduction member 26 is compressed when the first heat conduction member 26 is held between the first cover 12a and the second substrate 18 (the control unit 22) and the magnitude of a pressing force which is generated by compressing the first heat conduction member 26 and which is applied to the first wall 12e and the fifth face 22i by test or the like. The first heat conduction member 26 has flexibility, so that even when an external force is applied to the first cover 12a, it is possible to absorb the external force by the first heat conduction member 26 and to prevent the external force from being applied to the control unit 22.

In this way, the first heat conduction member 26 having flexibility is compressed when being held between the first cover 12a and the second substrate 18 (the control unit 22), so that the eighth face 26a of the first heat conduction member 26 is closely attached to the fifth face 22i of the control unit 22. As a result, the heat generated when the control unit 22 is driven can be efficiently transported to the first heat conduction member 26. In the same manner, the ninth face 26b of the first heat conduction member 26 is closely attached to the first wall 12e of the first cover 12a, so that the heat transported to the first heat conduction member 26 is further transported to the first cover 12a and the heat can be dissipated through the first cover 12a.

According to the present embodiment, the heat generated in the control unit 22 is transported by directly and closely attaching the eighth face 26a of the first heat conduction member 26 to the fifth face 22i of the control unit 22, which is a bare chip. Therefore, the number of layers from the control unit 22 to the first cover 12a is smaller than that in a case in which the control unit 22 is covered by a covering portion such as a resin, so that it is possible to reduce degradation of efficiency of heat transport. As a result, even when the frequency used in the control unit 22 is increased, the heat dissipation of the control unit 22 can be efficiently performed, so that it is possible to reduce that the function (performance) of the control unit 22 is degraded and the lifetime of the control unit 22 is reduced due to the heat generated by the control unit 22. Further, the transport of heat from the control unit 22 to the first cover 12a can be efficiently performed, so that it is possible to reduce the amount of heat transported to the second substrate 18 through the bumps 34. In other words, it is possible to reduce that the heat generated in the control unit 22 is transported to the storage unit 20 through the second substrate 18. As a result, it is possible to reduce that the storage unit 20, which generates heat when being operated, is further heated by external heat. Therefore, it is possible to reduce that the function (performance) of the storage unit 20 is degraded and the lifetime of the storage unit 20 is reduced due to the heat generated by the control unit 22.

In the example of FIG. 4, the first heat conduction member 26 covers the control unit 22 and also covers a part of the third face 18b around the control unit 22. As a result, even when part of the heat generated in the control unit 22 is transported to the second substrate 18 through the bumps 34, the heat can be transported to the first cover 12a through the first heat conduction member 26. Also in this configuration, it is possible to improve the transport efficiency of the heat generated in the control unit 22 to the first cover 12a. Further, when the heat generated in the storage unit 20 is transported to the second substrate 18 through the bumps 34, the heat can be transported to the first cover 12a through the first heat conduction member 26. As a result, it is possible to reduce that the heat generated in the storage unit 20 is transported to the control unit 22 to heat the control unit 22 and the heat is transported to another storage unit 20 to heat the another storage unit 20. In other words, it is possible to reduce that the functions of the control unit 22 and the storage unit 20 are degraded and the lifetimes of the control unit 22 and the storage unit 20 are reduced by the heat transported through the second substrate 18.

The first heat conduction member 26 may include an electrically insulating magnetic material that hardly allows radio waves to pass through. For example, a filler such as ferrite may be mixed into the synthetic resin material that forms the first heat conduction member 26. It is possible to take countermeasures against radio wave interference of the control unit 22 by covering the control unit 22 by the first heat conduction member 26 including the electrically insulating magnetic material in this manner. As a result, it is possible to more stabilize the operation of the control unit 22. The first heat conduction member 26 itself may have adhesiveness (adhesive force) to facilitate the operation to attach the first heat conduction member 26 to the semiconductor memory device 10. For example, when the first heat conduction member 26 is formed of silicon rubber or the like, it is possible to obtain necessary adhesive characteristics by changing a composition ratio between a silicon rubber component and a silicon resin component. It is possible to temporarily attach (stick) the first heat conduction member 26 to at least either one of the first wall 12e of the first cover 12a and the control unit 22 by using the adhesive characteristics of the first heat conduction member 26 when disposing the first heat conduction member 26 between the control unit 22 and the first cover 12a, so that it is possible to contribute to improving assembly workability. Regarding the adhesiveness (adhesive force), the adhesive force only has to be effective during the assembly work. However, the adhesive force may be permanently effective. Regarding the adhesive force, there ought to be an adhesive force to be able to easily attach or detach the first heat conduction member 26. In this case, it is easy to perform positioning and to retry the positioning when temporarily attaching the first heat conduction member 26, so that it is possible to contribute to improving the workability. The first heat conduction member 26 has adhesiveness, so that it is not necessary to use a separate adhesive or the like to temporarily attach the first heat conduction member 26 to the first wall 12e. When an adhesive or the like is disposed between the first heat conduction member 26 and the first cover 12a or the control unit 22, the numbers of interfaces and layers increase, so that it may cause degradation of the heat conductivity. On the other hand, when the first heat conduction member 26 itself has adhesiveness as in the present embodiment, it is possible to reduce that an unnecessary layer is formed, so that it is possible to reduce degradation of the heat conductivity. Further, in the present embodiment, an example is described in which the first heat conduction member 26 is formed into a rectangular parallelepiped shape according to the shape of the control unit 22. However, it is not limited to this and, for example, the first heat conduction member 26 may have a polygonal column shape or a circular column shape as long as the first heat conduction member 26 can cover the control unit 22. Also in this case, the same effect can be obtained.

Next, an assembly procedure of the semiconductor memory device 10 will be described. First, positioning between a plurality of bumps 34 formed on the fourth face 22h of the control unit 22 and electrode pads (not illustrated in the drawings) formed on the second substrate 18 is performed and the bumps 34 and the electrode pads are contacted with each other. In the same manner, positioning between a plurality of bumps 34 formed on the sixth face 20a of the storage unit 20 and electrode pads (not illustrated in the drawings) formed on the second substrate 18 is performed and the bumps 34 and the electrode pads are contacted with each other. Then, positioning between a plurality of bumps 32 formed on the second face 18a of the second substrate 18 of the element 16 combined in this way and electrode pads (not illustrated in the drawings) formed on the first face 14a of the first substrate 14 is performed and the bumps 32 and the electrode pads are contacted with each other. Thereafter, the bumps 34 and the bumps 32 are melted and a sub-assembly including a plurality of elements 16 (one package SSD) on the first substrate 14 is formed. Then, the sub-assembly is fixed to the second cover 12b by, for example, screws. On the other hand, the first heat conduction member 26 is temporarily attached to the first wall 12e of the first cover 12a. In other words, the first heat conduction member 26 is attached to (temporarily attached to) the first wall 12e by the adhesiveness (adhesive force) of the first heat conduction member 26 so that the first heat conduction member 26 covers a position corresponding to the control unit 22 of the sub-assembly fixed to the second cover 12b. Then, the second cover 12b and the first cover 12a are combined together and fixed by the fastening members 24 (screws). As a result, the first wall 12e of the first cover 12a pushes the ninth face 26b of the first heat conduction member 26 and compresses the first heat conduction member 26. In other words, the first heat conduction member 26 is closely attached to the first cover 12a and is also closely attached to the fifth face 22i of the control unit 22 and the third face 18b, so that it is possible to form a heat transport path that can efficiently transport heat from the control unit 22 to the first cover 12a. In the example described above, it is exemplified that the first heat conduction member 26 covers the entire surface of the fifth face 22i of the control unit 22. However, the same radiant heat effect as the above is obtained by such a configuration that the first heat conduction member 26 contacts with a portion of the fifth face 22i such as only a central portion of the fifth face 22i.

Second Embodiment

Figure 5:
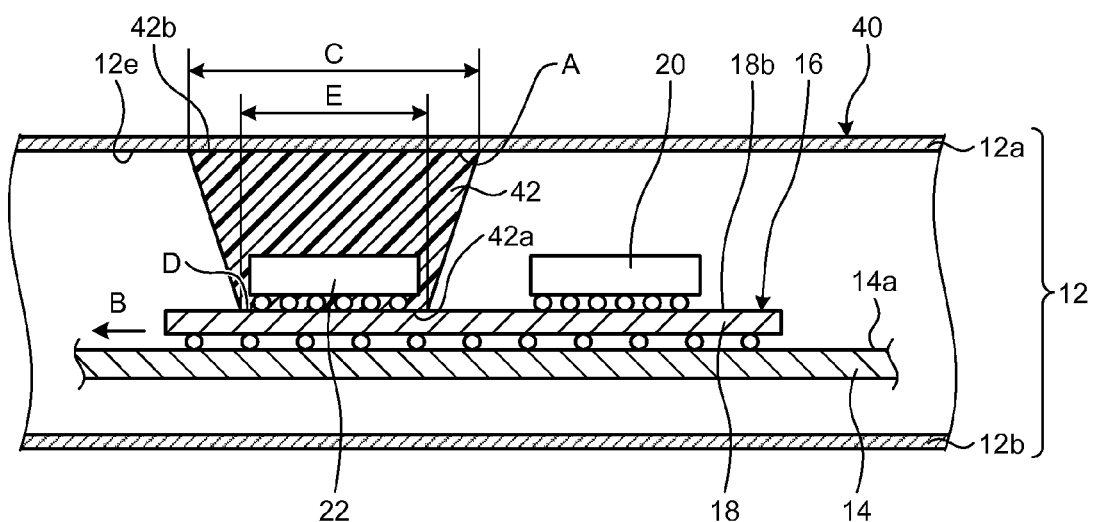
FIG. 5 is a cross-sectional view illustrating an example of a semiconductor memory device according to a second embodiment.

FIG. 5 is a cross-sectional view illustrating an example of a semiconductor memory device 40 according to a second embodiment. The configuration of the semiconductor memory device 40 is the same as that of the semiconductor memory device 10 of the first embodiment except that the shape of a first heat conduction member 42 is different, so that the same reference numerals are given to the same members and the detailed description thereof is omitted. Further, reference numerals of the same members are appropriately omitted. The same goes for the third and following embodiments.

In the semiconductor memory device 40, a plurality of elements 16 are supported on the first face 14a of the first substrate 14 fixed inside the case 12 in the same manner as in the semiconductor memory device 10 of the first embodiment. The element 16 is one package SSD that supports, for example, the control unit 22 and the storage unit 20, which are bare chips, on the third face 18b of the second substrate 18. The first heat conduction member 42 is formed of a material having flexibility (softness) in the same manner as the first heat conduction member 26. The first heat conduction member 42 is, for example, a synthetic resin material (silicone rubber, elastomer, flexible resin). The first heat conduction member 42 may include a filler such as carbon to improve the heat conductivity and may include an electrically insulating magnetic material such as, for example, ferrite, which hardly allows radio waves to pass through in order to take countermeasures against radio wave interference. The first heat conduction member 42 may have adhesiveness so as to enable temporary attachment during assembly. The configuration described above can be the same for the heat conduction members of the third and the following embodiments.

A width C of the first heat conduction member 42 in a first direction B along the first face 14a at a first position A in contact with the first wall 12e of the first cover 12a is greater than a width E of the first heat conduction member 42 in the first direction B at a second position D farther away from the first cover 12a (the case 12) than the first position A. Here, the "away from" means a distance away from a reference position. For example, in the first heat conduction member 42, when the eighth face 42a located at the second position D is the reference position, a position of a distance away from the eighth face 42a in a direction toward the first wall 12e is a position away from the eighth face 42a. As an example, the ninth face 42b located at the first position A is a face located at a position away from the eighth face 42a. Further, it can be said that a face located between the second position D and the first position A (for example, a surface in parallel with the eighth face 42a) is also a face away from the eighth face 42a. The first heat conduction member 42 is a truncated quadrangular pyramid where the area at the first position A (the area of the ninth face 42b) is greater than the area at the second position D (the area of the eighth face 42a). In this way, the shape of the first heat conduction member 42 is formed into a truncated quadrangular pyramid where the area of the face in contact with the first wall 12e is large, so that it is possible to increase the contact area between the first heat conduction member 42 and the first cover 12a. As a result, the heat generated in the control unit 22 is diffused widely in a process in which the heat is transported in the first heat conduction member 42. By this heat diffusion, it is possible to improve the heat dissipation efficiency of the first heat conduction member 42. As a result, it is possible to reduce that the function of the control unit 22 is degraded and the lifetime of the control unit 22 is reduced due to the heat generated in the control unit 22. Further, the contact area between the first heat conduction member 42 and the first cover 12a increases, so that it is possible to reduce that a heat receiving portion of the first cover 12a is reduced. As a result, it is possible to reduce that a part of the first cover 12a is excessively heated. Further, it is possible to more efficiently transport the heat generated in the control unit 22 to the first cover 12a and dissipate the heat than the first heat conduction member 26 of the first embodiment. As a result, the possibility that the heat generated in the control unit 22 is transported to the storage unit 20 through the second substrate 18 is reduced, so that it is possible to reduce that the function of the storage unit 20 is degraded and the lifetime of the storage unit 20 is reduced due to the heat generated in the control unit 22.

Regarding the shape of the first heat conduction member 42, as an example, a truncated quadrangular pyramid is illustrated corresponding to the shape of the control unit 22. However, the area at the first position A only has to be greater than the area at the second position D, and the shape of the ninth face 42b and the shape of the eighth face 42a of the first heat conduction member 42 need not be a square or a rectangle. For example, the shapes may be a circle and a part may be missing or projected. Also in these cases, the same effect can be obtained. Further, although a case is described in which the shape of the first heat conduction member 42 is a truncated quadrangular pyramid, it is not limited to this, and even when the shape is a circular truncated cone or any other frustum, the same effect can be obtained.

Third Embodiment

Figure 6:
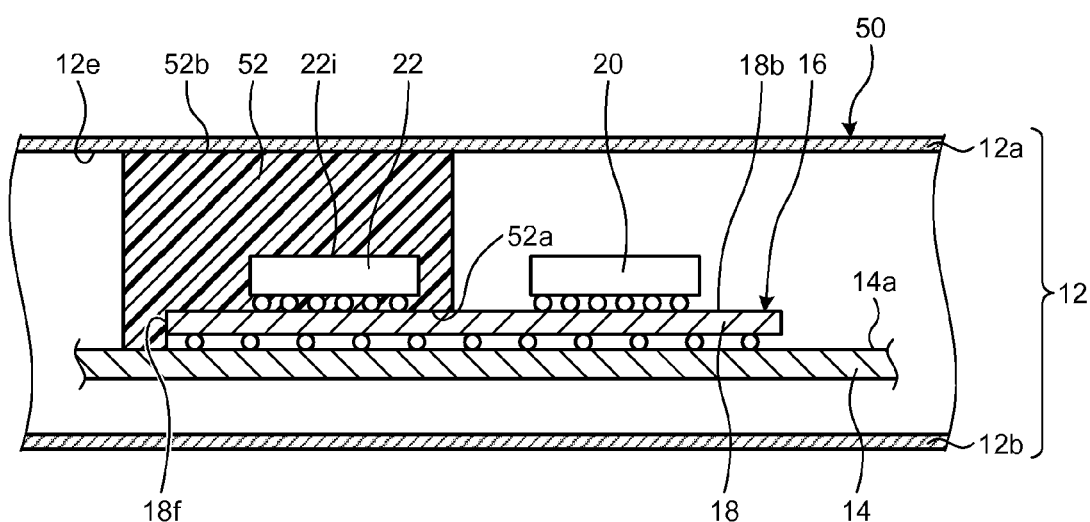
FIG. 6 is a cross-sectional view illustrating an example of a semiconductor memory device according to a third embodiment.

FIG. 6 is a cross-sectional view illustrating an example of a semiconductor memory device 50 according to a third embodiment. The shape of a first heat conduction member 52 of the semiconductor memory device 50 is different from those of the first and the second embodiments. In the same manner as the first heat conduction member 26 of the first embodiment, a ninth face 52b of the first heat conduction member 52 is in contact with the first wall 12e of the first cover 12a. On the other hand, an eighth face 52a of the first heat conduction member 52 is thermally connected (closely attached) to the fifth face 22i of the control unit 22 and the third face 18b of the second substrate 18 and covers the fifth face 22i and the third face 18b. Further, the first heat conduction member 52 is thermally connected (closely attached) to a part of the first face 14a of the first substrate 14 and covers the part of the first face 14a. In other words, the first heat conduction member 52 covers the first face 14a, the third face 18b, and the control unit 22 and is disposed in a state in which the first heat conduction member 52 is held between and compressed by the first face 14a, the third face 18b, the control unit 22, and the first cover 12a (the case 12). The heat is transported to the first cover 12a by covering the heat source and the peripheral region of the heat source by the first heat conduction member 52 which is larger than those of the first and the second embodiments described above. As a result, it is possible to transport the heat generated in the control unit 22 to the first cover 12a and also to transport a part of the heat generated in the control unit 22 which is transported to the second substrate 18 and a part of the heat which is further transported to the first substrate 14 to the first cover 12a through the first heat conduction member 52. Thereby, it is possible to improve the heat dissipation efficiency of the semiconductor memory device 50. As a result, it is possible to reduce that the function of the control unit 22 is degraded and the lifetime of the control unit 22 is reduced due to the heat generated in the control unit 22. As a result, it is reduced that the heat generated in the control unit 22 is transported to the storage unit 20 through the second substrate 18, so that it is possible to reduce that the function of the storage unit 20 is degraded and the lifetime of the storage unit 20 is reduced due to the heat generated in the control unit 22. As described above, when the second substrate 18 has a multi-layer structure and includes a layer, where the heat can be transported, such as a ground layer among the layers, as illustrated in FIG. 6, the first heat conduction member 52 can easily receive the heat transported by the ground layer because the first heat conduction member 52 is in contact with the side face 18f and the side face 18c of the second substrate 18 (see FIG. 1). As a result, it is possible to contribute to improving the heat dissipation of the second substrate 18.

Fourth Embodiment

Figure 7:
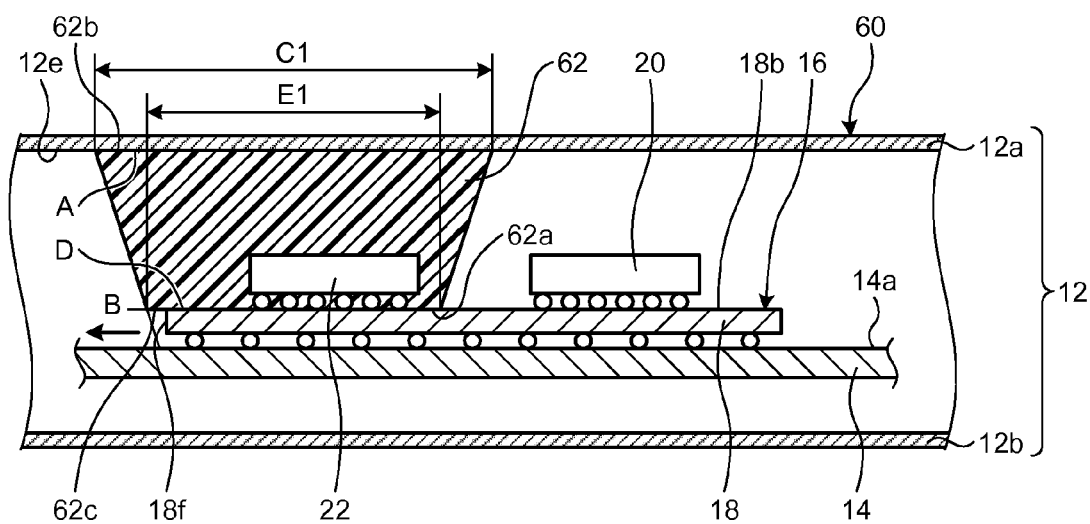
FIG. 7 is a cross-sectional view illustrating an example of a semiconductor memory device according to a fourth embodiment.

FIG. 7 is a cross-sectional view illustrating an example of a semiconductor memory device 60 according to a fourth embodiment. A first heat conduction member 62 of the semiconductor memory device 60 has a shape similar to that of the first heat conduction member 42 of the second embodiment illustrated in FIG. 5. Specifically, a width C1 of the first heat conduction member 62 in the first direction B along the first face 14a at the first position A in contact with the first wall 12e of the first cover 12a is greater than a width E1 of the first heat conduction member 62 in the first direction B at the second position D farther away from the first cover 12a (the case 12) than the first position A. In other words, the first heat conduction member 62 is a truncated quadrangular pyramid where the area at the first position A (the area of a ninth face 62b) is greater than the area at the second position D (the area of a face 62C along a face in contact with the third face 18b).

In this way, the shape of the first heat conduction member 62 is formed into a truncated quadrangular pyramid where the area of the face in contact with the first wall 12e is large, so that it is possible to increase the contact area between the first heat conduction member 62 and the first cover 12a. As a result, the heat generated in the control unit 22 is diffused widely in a process in which the heat is transported in the first heat conduction member 62. By this heat diffusion, it is possible to improve the heat dissipation efficiency of the first heat conduction member 62. As a result, it is possible to reduce that the function of the control unit 22 is degraded and the lifetime of the control unit 22 is reduced due to the heat generated in the control unit 22. Further, the contact area between the first heat conduction member 62 and the first cover 12a increases, and thereby it is reduced that a heat receiving portion of the first cover 12a is reduced, so that it is possible to reduce that a part of the first cover 12a is excessively heated by the heat dissipation.

Further, a part of the eighth face 62a of the first heat conduction member 62 is thermally connected (closely attached) to the first face 14a. Therefore, it is possible to transport a part of the heat generated in the control unit 22 which is transported to the second substrate 18 and a part of the heat which is further transported to the first substrate 14 to the first cover 12a through the first heat conduction member 62. Thereby, it is possible to improve the heat dissipation efficiency of the semiconductor memory device 60. Further, it is possible to reduce that the heat generated in the control unit 22 is transported to the storage unit 20 through the second substrate 18 by a fact that the heat dissipation efficiency of the heat generated in the control unit 22 is improved. As a result, it is possible to reduce that the function of the storage unit 20 is degraded and the lifetime of the storage unit 20 is reduced due to the heat generated in the control unit 22. As described above, when the second substrate 18 has a multi-layer structure and includes a layer, where the heat can be transported, such as a ground layer among the layers, in the same manner as the first heat conduction member 52 of the third embodiment, the first heat conduction member 62 can easily receive the heat transported by the ground layer of the second substrate 18 at the side face 18f and the side face 18c with which the first heat conduction member 62 is in contact. As a result, the heat transported by the second substrate 18 can be transported to the first cover 12a, so that it is possible to contribute to improving the heat dissipation of the semiconductor memory device 60.

Regarding the shape of the first heat conduction member 62, as an example, a truncated quadrangular pyramid is illustrated corresponding to the shape of the control unit 22. However, the area at the first position A only has to be greater than the area at the second position D, and the shape of the ninth face 62b and the shape of the eighth face 62a of the first heat conduction member 62 need not be a square or a rectangle. For example, the shapes may be a circle and a part may be missing or projected. Also in these cases, the same effect can be obtained. Further, although a case is described in which the shape of the first heat conduction member 62 is a truncated quadrangular pyramid, it is not limited to this, and even when the shape is a circular truncated cone or any other frustum, the same effect can be obtained.

Fifth Embodiment

Figure 8:
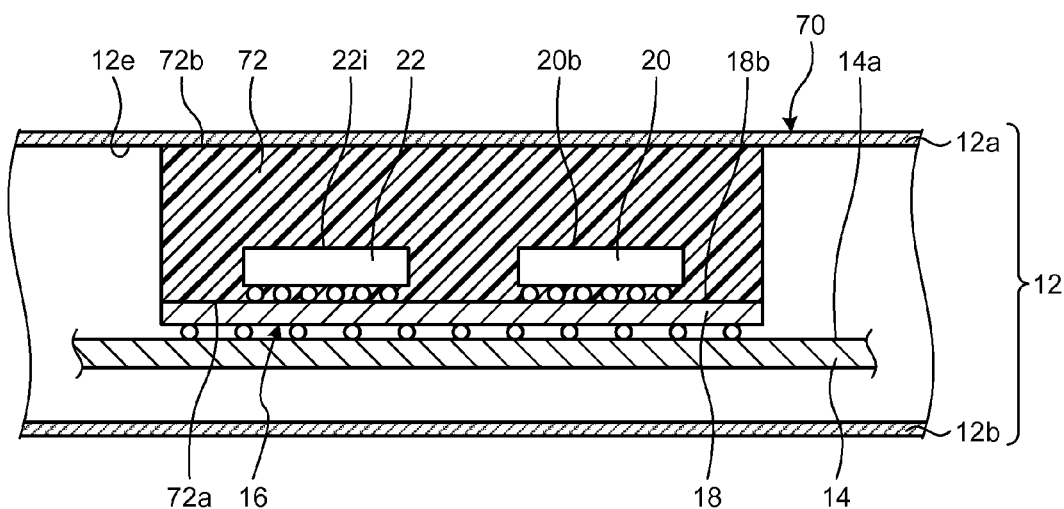
FIG. 8 is a cross-sectional view illustrating an example of a semiconductor memory device according to a fifth embodiment.

FIG. 8 is a cross-sectional view illustrating an example of a semiconductor memory device 70 according to a fifth embodiment. In the same manner as the first heat conduction member 26 of the first embodiment, a ninth face 72b of the first heat conduction member 72 of the semiconductor memory device 70 is thermally connected (closely attached) to the first wall 12e of the first cover 12a. On the other hand, an eighth face 72a of the first heat conduction member 72 is thermally connected (closely attached) to the fifth face 22i of the control unit 22 and the third face 18b of the second substrate 18 and covers the fifth face 22i and the third face 18b. Further, the first heat conduction member 72 is thermally connected (closely attached) to the seventh face 20b of the storage unit 20 supported by the second substrate 18 and covers the seventh face 20b. In other words, the first heat conduction member 72 is disposed in a state in which the first heat conduction member 72 is held between and compressed by the third face 18b, the control unit 22, the storage unit 20, and the first cover 12a (the case 12). When the second substrate 18 supports three storage units 20 as illustrated in FIG. 1, the control unit 22 and all of the three storage units 20 are thermally connected to the first heat conduction member 72 and covered by the first heat conduction member 72. As a result, the first heat conduction member 72 transports both the heat generated in the control unit 22 and the heat generated in the storage units 20 to the first cover 12a. In other words, it is possible to improve the heat dissipation efficiency of the entire element 16 (the entire semiconductor memory device 70). Therefore, it is possible to reduce that the function of the element 16 is degraded and the lifetime of the element 16 is reduced due to the heat generated in the element 16.

The first heat conduction member 72 need not cover all of a plurality of the storage units 20, and the first heat conduction member 72 may cover one control unit 22 and one or two storage units 20. For example, when there is a storage unit 20 that generates a small amount of heat compared to other storage units 20 and the heat can be sufficiently dissipated by natural heat dissipation inside the case 12, the storage unit 20 need not be covered by the first heat conduction member 72. For example, it is allowed that a cut-out portion is formed in a part of the first heat conduction member 72 and the storage unit 20 is not covered. When the heat is dissipated inside the case 12, for example, the heat may be dissipated through a ventilating opening (not illustrated in the drawings) provided to the case 12 or air may be exhausted by an air blowing device (ventilation device).

Sixth Embodiment

Figure 9:
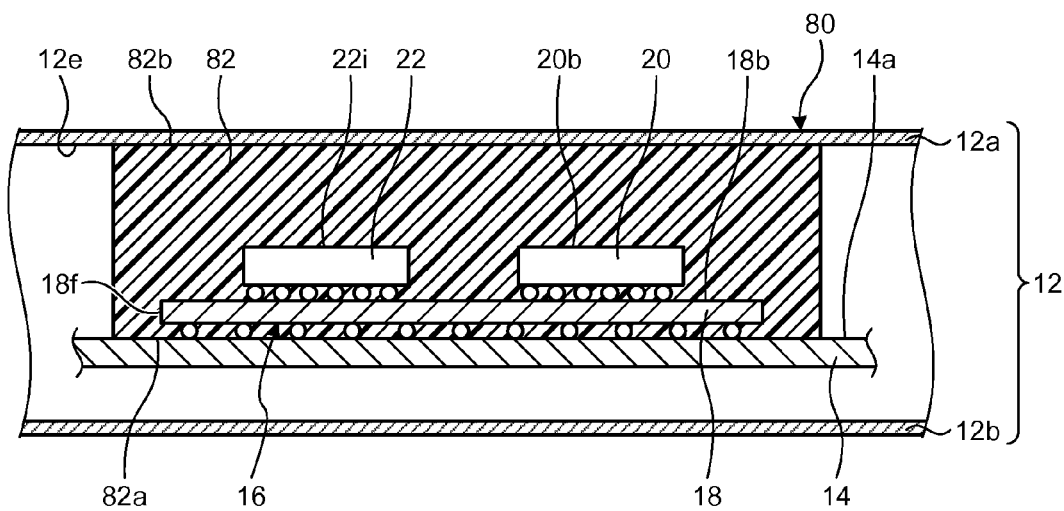
FIG. 9 is a cross-sectional view illustrating an example of a semiconductor memory device according to a sixth embodiment.

FIG. 9 is a cross-sectional view illustrating an example of a semiconductor memory device 80 according to a sixth embodiment. In the same manner as the first heat conduction member 72 of the fifth embodiment, a ninth face 82b of a first heat conduction member 82 of the semiconductor memory device 80 is thermally connected (closely attached) to the first wall 12e of the first cover 12a. An eighth face 82a of the first heat conduction member 82 is thermally connected (closely attached) to the fifth face 22i of the control unit 22, the third face 18b of the second substrate 18, and the seventh face 20b of the storage unit 20 supported by the second substrate 18, and covers the fifth face 22i, the third face 18b, and the seventh face 20b. Further, the first heat conduction member 82 is thermally connected to a part of the first surface 14a of the first substrate 14 and covers the part of the first face 14a. In other words, the first heat conduction member 82 is disposed in a state in which the first heat conduction member 82 is held between and compressed by the first face 14a, the third face 18b, the control unit 22, the storage unit 20, and the first cover 12a (the case 12). Therefore, the first heat conduction member 82 covers the entire element 16 which is one package SSD including the control unit 22 and the storage unit 20 that are bare chips and the second substrate 18. As a result, it is possible to transport the heat generated in the control unit 22 and the storage unit 20 to the first cover 12a and also to transport a part of the heat generated in the control unit 22 and the storage unit 20 which is transported to the second substrate 18 and a part of the heat which is further transported to the first substrate 14 to the first cover 12a through the first heat conduction member 82. Thereby, it is possible to improve the heat dissipation efficiency of the semiconductor memory device 80. As a result, it is possible to reduce that the functions of the control unit 22 and the storage unit 20 are degraded and the lifetimes of the control unit 22 and the storage unit 20 are reduced due to the heat generated in the element 16.

In the same manner as the semiconductor memory device 60 illustrated in FIG. 7, when the second substrate 18 has a multi-layer structure and includes a layer, where the heat can be transported, such as a ground layer among the layers, the first heat conduction member 82 comes into contact with the side faces 18f, 18c, 18d, and 18e of the second substrate 18 (see FIG. 1). As a result, the first heat conduction member 82 can easily receive the heat transported by the ground layer of the second substrate 18, so that the first heat conduction member 82 can contribute to improving the heat dissipation of the second substrate 18.

When a plurality of elements 16 are arranged on the first face 14a of the first substrate 14 as illustrated in FIG. 1, one first heat conduction member 82 may collectively cover the plurality of elements 16 or the first heat conduction members 82 may cover the elements 16 on a one-on-one basis. When one first heat conduction member 82 collectively covers the plurality of elements 16, it is possible to contribute to reduction of the number of the first heat conduction members 82 and simplification of mounting work of the first heat conduction members 82. Further, when the first heat conduction members 82 cover the elements 16 on a one-on-one basis, the heat transport path can be divided for each element 16, so that it is possible to make it difficult for the element 16 to be affected by the heat of an adjacent element 16.

When the entire element 16 is covered as in the case of the first heat conduction members 82, it is possible to relax the accuracy of the mounting work when the first heat conduction members 82 are mounted on the semiconductor memory device 80. For example, when the first heat conduction member 26 is mounted so as to cover the fifth face 22i of the control unit 22 as in the first embodiment, the positioning accuracy needs to be improved so that the control unit 22 is not extruded from the eighth face 26a of the first heat conduction member 26. On the other hand, when the entire element 16 is covered as in the case of the first heat conduction members 82 of the semiconductor memory device 80, even if some position shift occurs, the possibility is low that the control unit 22 and the storage unit 20, which are heat sources, is extruded from the first heat conduction members 82. In other words, even when the mounting accuracy of the first heat conduction members 82 is relaxed, it is possible to make it difficult for the heat dissipation efficiency of the element 16 to degrade. Also in the case of the first heat conduction members 82, in the same manner as the first heat conduction members 72, the first heat conduction members 82 need not cover all of the plurality of storage units 20, and the first heat conduction members 82 may cover one control unit 22 and specific storage units 20 where the heat dissipation efficiency is desired to be improved.

Seventh Embodiment

Figure 10:
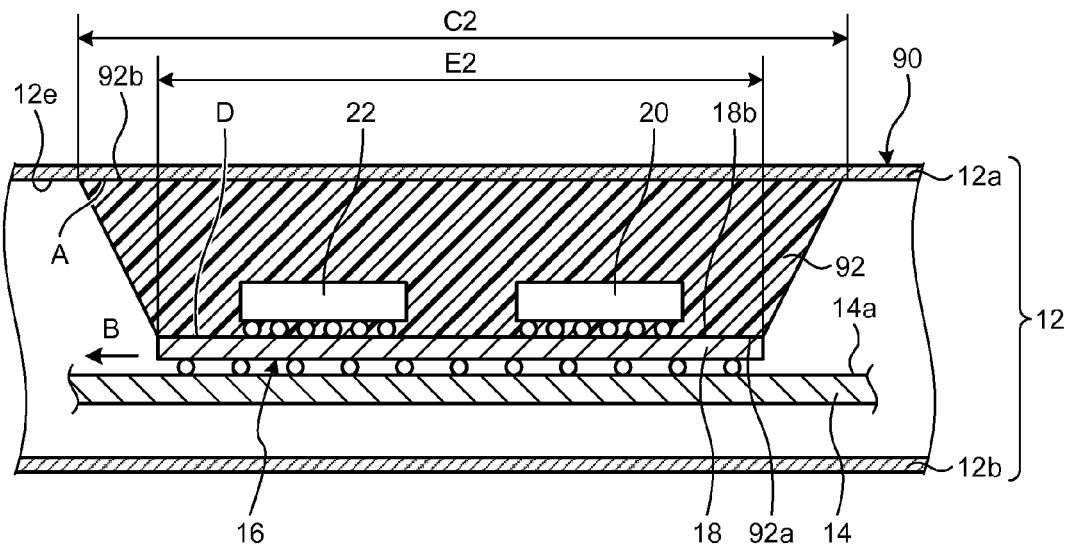
FIG. 10 is a cross-sectional view illustrating an example of a semiconductor memory device according to a seventh embodiment.

FIG. 10 is a cross-sectional view illustrating an example of a semiconductor memory device 90 according to a seventh embodiment. A first heat conduction member 92 of the semiconductor memory device 90 is a modified example having the features of the first heat conduction member 72 of the fifth embodiment and the features of the first heat conduction member 42 of the second embodiment. Specifically, a width C2 of the first heat conduction member 92 in the first direction B along the first face 14a at the first position A in contact with the first wall 12e of the first cover 12a is greater than a width E2 of the first heat conduction member 92 in the first direction B at the second position D farther away from the first cover 12a (the case 12) than the first position A. In other words, the first heat conduction member 92 is a truncated quadrangular pyramid where the area at the first position A (the area of a ninth face 92b) is greater than the area at the second position D (the area of an eighth face 92a). In this way, the shape of the first heat conduction member 92 is formed into a truncated quadrangular pyramid where the area of the face in contact with the first wall 12e is large, so that it is possible to increase the contact area between the first heat conduction member 92 and the first cover 12a. As a result, the heat generated in the control unit 22 and the storage unit 20 is diffused widely in a process in which the heat is transported in the first heat conduction member 92. By this heat diffusion, it is possible to improve the heat dissipation efficiency of the first heat conduction member 92. As a result, it is possible to reduce that the functions of the control unit 22 and the storage unit 20 are degraded and the lifetimes of the control unit 22 and the storage unit 20 are reduced due to the heat generated in the control unit 22 and the storage unit 20. Further, the contact area between the first heat conduction member 92 and the first cover 12a increases, and thereby it is reduced that a heat receiving portion of the first cover 12a is reduced, so that it is possible to reduce that a part of the first cover 12a is excessively heated by the heat dissipation. Further, it is possible to more efficiently transport the heat generated in the control unit 22 and the storage unit 20 to the first cover 12a and dissipate the heat than the first heat conduction member 72 of the fifth embodiment.

Eighth Embodiment

Figure 11:
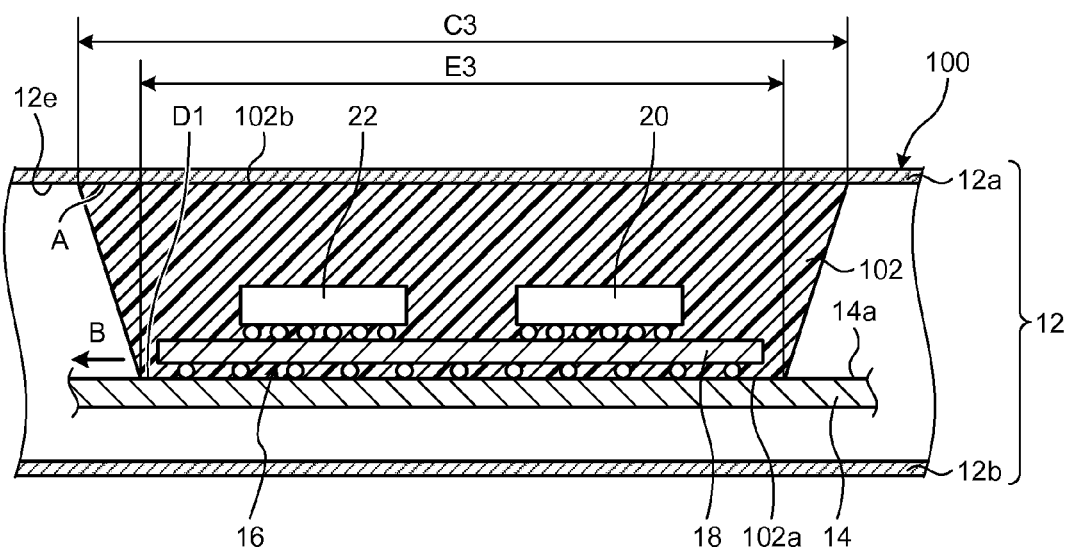
FIG. 11 is a cross-sectional view illustrating an example of a semiconductor memory device according to an eighth embodiment.

FIG. 11 is a cross-sectional view illustrating an example of a semiconductor memory device 100 according to an eighth embodiment. A first heat conduction member 102 of the semiconductor memory device 100 is a modified example having the features of the first heat conduction member 92 of the seventh embodiment and the features of the first heat conduction member 82 of the sixth embodiment. Specifically, a width C3 of the first heat conduction member 102 in the first direction B along the first face 14a at the first position A in contact with the first wall 12e of the first cover 12a is greater than a width E3 of the first heat conduction member 102 in the first direction B at the second position D1 farther away from the first cover 12a (the case 12) than the first position A. In other words, the first heat conduction member 102 is a truncated quadrangular pyramid where the area at the first position A (the area of a ninth face 102b) is greater than the area at the second position D1 (the area of an eighth face 102a).

The first heat conduction member 102 covers the entire element 16 which is one package SSD including the control unit 22 and the storage unit 20 that are bare chips and the second substrate 18. As a result, it is possible to transport the heat generated in the control unit 22 and the storage unit 20 to the first cover 12a and also to transport a part of the heat generated in the control unit 22 and the storage unit 20 which is transported to the second substrate 18 and a part of the heat which is further transported to the first substrate 14 to the first cover 12a through the first heat conduction member 102. Further, it is possible to increase the contact area between the first heat conduction member 102 and the first cover 12a by forming the first heat conduction member 102 into a truncated quadrangular pyramid. As a result, the heat generated in the control unit 22 and the storage unit 20 is diffused widely in a process in which the heat is transported in the first heat conduction member 102. By this heat diffusion, it is possible to improve the heat dissipation efficiency of the first heat conduction member 102. In other words, it is possible to efficiently transport the heat generated in the element 16 to the first cover 12a and dissipate the heat. As a result, it is possible to reduce that the functions of the control unit 22 and the storage unit 20 are degraded and the lifetimes of the control unit 22 and the storage unit 20 are reduced due to the heat generated in the control unit 22 and the storage unit 20. Further, the contact area between the first heat conduction member 102 and the first cover 12a increases, and thereby it is reduced that a heat receiving portion of the first cover 12a is reduced, so that it is possible to reduce that a part of the first cover 12a is excessively heated by the heat dissipation.

When the second substrate 18 has a multi-layer structure and includes a layer, where the heat can be transported, such as a ground layer among the layers, the first heat conduction member 102 can easily receive the heat transported by the ground layer of the second substrate 18 because the first heat conduction member 102 is in contact with the side faces 18f, 18c, 18d, and 18e of the second substrate 18 (see FIG. 1). As a result, it is possible to contribute to improving the heat dissipation efficiency of the second substrate 18.

Ninth Embodiment

Figure 12:
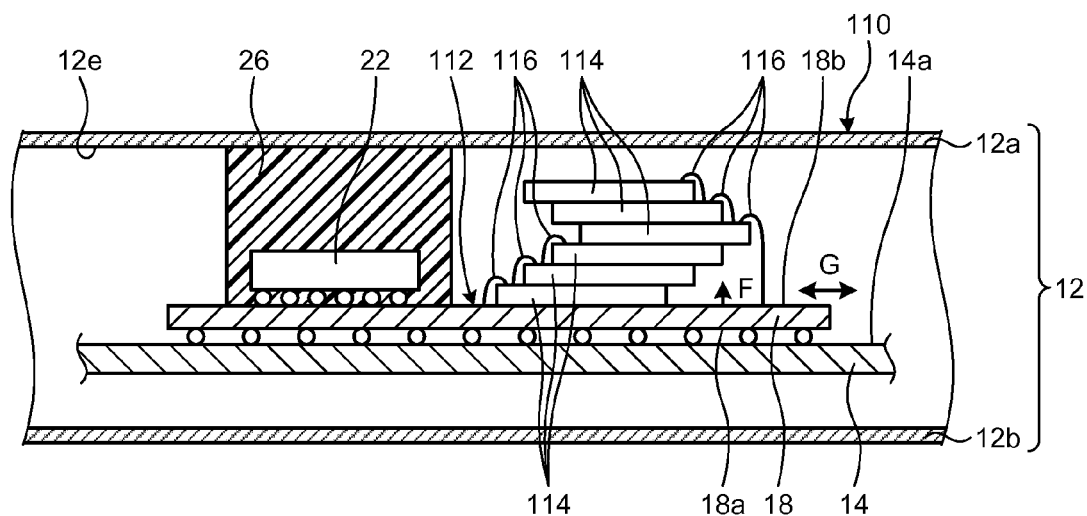
FIG. 12 is a cross-sectional view illustrating an example of a semiconductor memory device according to a ninth embodiment.

FIG. 12 is a cross-sectional view illustrating an example of a semiconductor memory device 110 according to a ninth embodiment. The semiconductor memory device 110 is a modified example of the semiconductor memory device 10 of the first embodiment and the configuration of the first heat conduction member 26 that covers the control unit 22 and the mode of the heat transport are the same as those of the semiconductor memory device 10. In the same manner as in the other embodiments, the semiconductor memory device 110 also includes a plurality of elements 112 on the first face 14a of the first substrate 14. The element 112 is one package SSD in the same manner as in the other embodiments and includes the second substrate 18, the control unit 22 (bare chip), and a plurality of storage units 114 (bare chips). In the case of the element 112, the plurality of storage units 114 are stacked in the thickness direction F of the storage unit 114. In this case, the storage units 114 are stacked in a staircase pattern by being shifted, for example, in the second direction G along the third face 18b so that the storage units 114 can be connected by, for example, bonding wires 116. As a result, it is possible to reduce the area of the third face 18b required to arrange the storage units 114 as compared with a case in which the storage units 20 are planarly arranged on the third face 18b as illustrated in FIG. 1. In other words, it is possible to reduce the size of the second substrate 18 without reducing the storage capacity of the element 112. Thus, it is possible to reduce the size of the element 112.

In the semiconductor memory device 110, the heat generated in the control unit 22 is transported to the first cover 12a through the first heat conduction member 26 and dissipated from the first cover 12a in the same manner as in the semiconductor memory device 10 illustrated in FIG. 4. As a result, it is possible to reduce that the function of the control unit 22 is degraded and the lifetime of the control unit 22 is reduced due to the heat generated in the control unit 22. Further, the heat generated in the control unit 22 is efficiently dissipated, so that the possibility that the heat generated in the control unit 22 is transported to the storage unit 114 through the second substrate 18 is reduced and it is possible to reduce that the function of the storage unit 114 is degraded and the lifetime of the storage unit 114 is reduced due to the heat generated in the control unit 22. The first heat conduction member 26 may be replaced with the first heat conduction member 42, 52, 62, or the like. In this case, the effect of each heat conduction member can be obtained in the semiconductor memory device 110.

Tenth Embodiment

Figure 13:
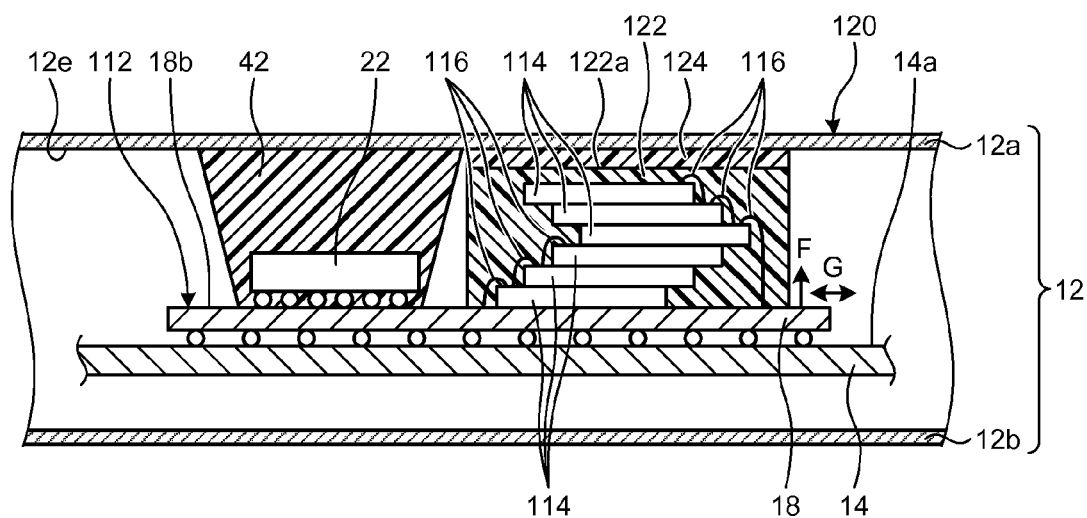
FIG. 13 is a cross-sectional view illustrating an example of a semiconductor memory device according to a tenth embodiment.

FIG. 13 is a cross-sectional view illustrating an example of a semiconductor memory device 120 according to a tenth embodiment. The semiconductor memory device 120 is a modified example of the semiconductor memory device 110 of the ninth embodiment, and an example is illustrated in which the control unit 22 is covered by the first heat conduction member 42 of the second embodiment illustrated in FIG. 5. Therefore, the effects related to the transport of the heat generated in the control unit 22 and the heat dissipation from the first cover 12a are the same as those of the second embodiment, so that the detailed description thereof is omitted.

A plurality of storage units 114 are stacked in the thickness direction F of the storage unit 114 in the same manner as in the ninth embodiment illustrated in FIG. 12. In this case, the storage units 114 are stacked in a staircase pattern by being shifted, for example, in the second direction G along the third face 18b so that the storage units 114 can be connected by, for example, bonding wires 116. In the element 112 of the semiconductor memory device 120, the storage units 114 and the bonding wires 116 are covered and protected by a covering portion 122 (mold, reinforcing member, cover) formed of a synthetic resin material or the like. The covering portion 122 can be formed by, for example, covering the storage units 114 and the bonding wires 116 with, for example, a liquid synthetic resin material and then curing the liquid synthetic resin material. The shock resistance of the storage units 114 that are provided with the covering portion 122 can be improved as compared with the storage units 114 of the semiconductor memory device 110 illustrated in FIG. 12. As described above, the heat generated in the storage units 114 is dissipated through the covering portion 122. Therefore, for example, a heat conduction member 124 may be disposed in a compressed state between an upper face 122a of the covering portion 122 opposite to the third face 18b and the first wall 12e of the first cover 12a. The heat conduction member 124 can be formed into, for example, a block shape (rectangular parallelepiped, cube) by using, for example, the same synthetic resin material (silicone rubber, elastomer, flexible resin) as that of the first heat conduction member 42. According to this configuration, the heat generated in the storage units 114 can be transported to the first cover 12a through the covering portion 122 and dissipated, so that it is possible to reduce that the function of the storage units 114 is degraded and the lifetime of the storage units 114 is reduced due to the heat generated in the storage units 114. Further, the possibility that the heat generated in the storage units 114 is transported to the control unit 22 through the second substrate 18 is reduced. As a result, it is possible to reduce that the function of the control unit 22 is degraded and the lifetime of the control unit 22 is reduced due to the heat generated in the storage units 114. The first heat conduction member 42 may be replaced with the first heat conduction member 26, 52, 62, or the like. In this case, the effect of each heat conduction member can be obtained in the semiconductor memory device 120.

Eleventh Embodiment

Figure 14:
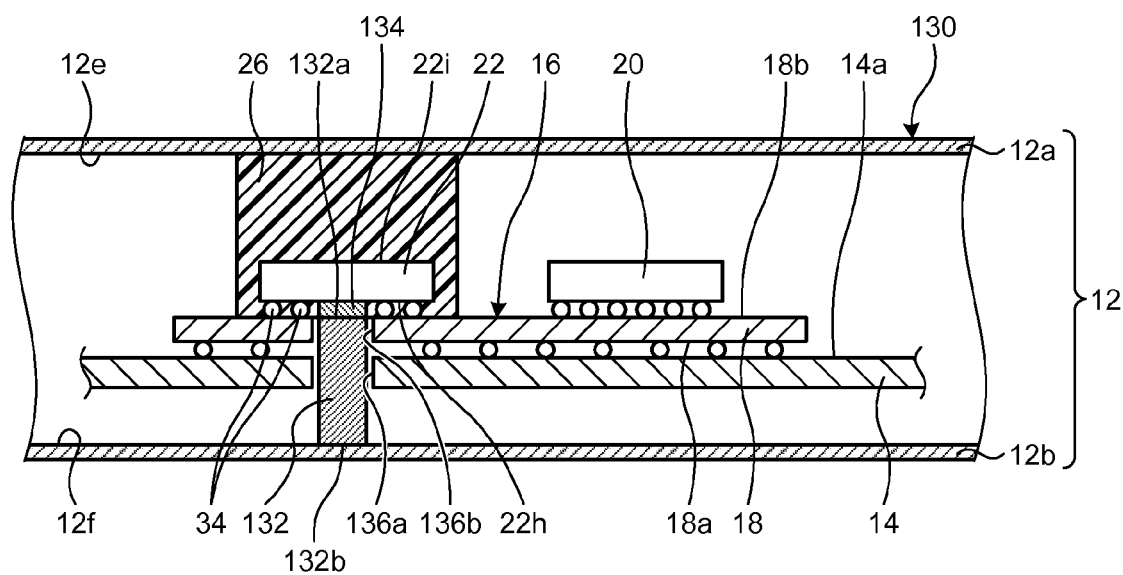
FIG. 14 is a cross-sectional view illustrating an example of a semiconductor memory device according to an eleventh embodiment.

FIG. 14 is a cross-sectional view illustrating an example of a semiconductor memory device 130 according to an eleventh embodiment. The semiconductor memory device 130 is a modified example of the semiconductor memory device 10 of the first embodiment and the configuration of the first heat conduction member 26 that covers the control unit 22 and the mode of the heat transport are the same as those of the semiconductor memory device 10. The element 16 (the control unit 22) of the semiconductor memory device 130 is thermally connected (closely attached) to, for example, the second cover 12b of the case 12 through a second heat conduction member 132 arranged separately from the first heat conduction member 26. Specifically, the case 12 includes a first wall 12e (a wall of the first cover 12a) in contact with the first heat conduction member 26 and a second wall 12f (a wall of the second cover 12b) located opposite to the first wall 12e with respect to the first substrate 14. The second heat conduction member 132 penetrates through the first substrate 14 and is thermally connected (closely attached) to the second wall 12f. Specifically, the second heat conduction member 132 is a rod-shaped member including a tenth face 132a thermally connected to a heat conducting pad (a heat conduction pad) 134 formed on the fourth face 22h of the control unit 22 and an eleventh face 132b thermally connected to the second wall 12f of the second cover 12b at the position opposite to the tenth face 132a.

For example, the first heat conduction member 26 can transport the heat generated in the control unit 22 from the fifth face 22i to the first cover 12a. On the other hand, the second heat conduction member 132 that penetrates through the first substrate 14 and the second substrate 18 can transport the heat generated in the control unit 22 to the second cover 12b through the fourth face 22h while reducing that the heat generated in the control unit 22 is transported to the first substrate 14 and the second substrate 18.

Figure 15:
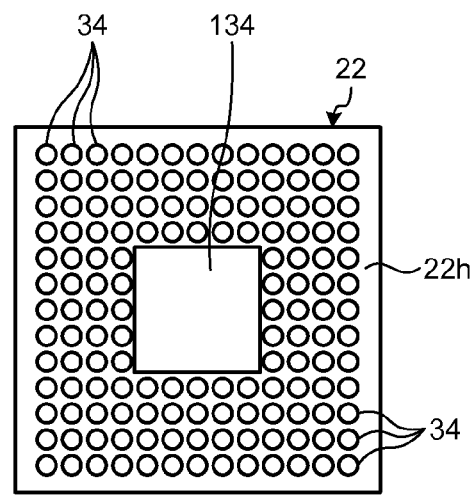
FIG. 15 is a plan view illustrating an example of a shape of a heat conducting pad of a control unit of the semiconductor memory device according to the eleventh embodiment.

FIG. 15 is a plan view of the control unit 22 when seen from the fourth face 22h and is a diagram illustrating the shape of the heat conducting pad 134 that is thermally connected (closely attached) to the second heat conduction member 132. In the case of the example illustrated in FIG. 15, the heat conducting pad 134 is formed in, for example, a central region of the fourth face 22h in a square shape. The heat conducting pad 134 can be formed of, for example, a metal having good heat conductivity, such as copper. A plurality of bumps 34 for inputting and outputting signals of the control unit 22 are arranged around the heat conducting pad 134 and the bumps 34 can be electrically connected to the third face 18b of the second substrate 18.

Figure 16:
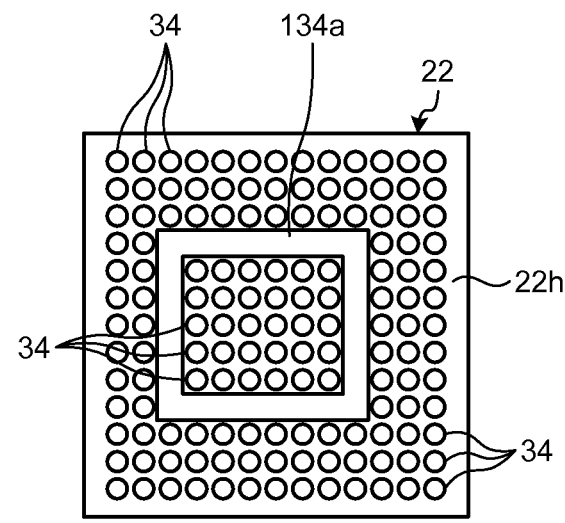
FIG. 16 is a plan view illustrating another example of the shape of the heat conducting pad.
Figure 17:
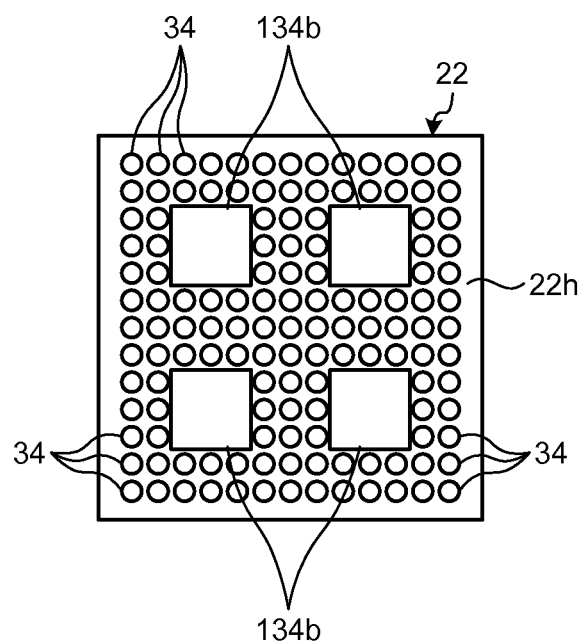
FIG. 17 is a plan view illustrating another example of the shape of the heat conducting pad.

The shape of the heat conducting pad 134 is not limited to the square illustrated in FIG. 15, and a heat conducting pad 134a having a rectangular frame shape as illustrated in FIG. 16 may be used. In this case, the bumps 34 can be arranged inside the rectangular frame shape of the heat conducting pad 134a. For example, when the bumps 34 need to be arranged in a central region of the fourth face 22h for reasons of the configuration of the control unit 22, the heat conducting pad 134a having such a rectangular frame shape can be employed. Further, as illustrated in FIG. 17, a plurality of (in the case of FIG. 17, four) heat conducting pads 134b having a square shape smaller than the heat conducting pad 134 illustrated in FIG. 15 may be separately arranged. Also in this case, when the positions on the fourth face 22h where the bumps 34 are arranged are predetermined for reasons of the configuration of the control unit 22, it is possible to arrange the heat conducting pads 134b by avoiding the positions of the bumps 34. The area where the heat conducting pad 134, 134a, or 134b functions as a heat conducting path can be appropriately determined from the heat conducting efficiency, the area occupied by the bumps 34, the arrangement of the bumps 34, and the like. The shapes and the arrangements of the heat conducting pads 134, 134a, and 134b illustrated in FIGS. 15 to 17 are an example and can be appropriately modified. For example, the shape of the heat conducting pad 134 may be a circle or a triangle.

Returning to FIG. 14, the second heat conduction member 132 may be formed of, for example, a synthetic resin material (silicone rubber, elastomer, flexible resin) in the same manner as the first heat conduction member 26 or may be formed of a metal having heat conductivity, such as copper as long as the second heat conduction member 132 can transport heat. When the second heat conduction member 132 is formed of a synthetic resin, it is allowed that the second heat conduction member 132 is provided with flexibility and is disposed in a compressed state between the heat conducting pad 134 and the second wall 12f of the second cover 12b. In other words, the dimension of the second heat conduction member 132 in the thickness direction (the held direction) in a free state in which the second heat conduction member 132 is not held between the heat conducting pad 134 (the element, the control unit) and the second cover 12b (the case) is greater than the dimension of the second heat conduction member 132 in the thickness direction (the held direction) when the second heat conduction member 132 is held between the heat conducting pad 134 (the element) and the second cover 12b (the case). In this case, the second heat conduction member 132 comes into contact with each face of the heat conducting pad 134 and the second wall 12f and can improve the efficiency of the heat transport. The second heat conduction member 132 may be provided with adhesiveness (adhesive force) in the same manner as the first heat conduction member 26. In this case, it is possible to temporarily attach (stick) the second heat conduction member 132 to at least either one of the second cover 12b and the heat conducting pad 134 (the element, the control unit) when assembling the semiconductor memory device 130, so that it is possible to contribute to improving the assembling efficiency. Regarding the adhesiveness (adhesive force), the adhesive force only has to be effective during the assembly work. However, the adhesive force may be permanently effective. Regarding the adhesive force, there ought to be an adhesive force to be able to easily attach or detach the second heat conduction member 132. In this case, it is easy to perform positioning and to retry the positioning when temporarily attaching the second heat conduction member 132, so that it is possible to contribute to improving the workability. When the second heat conduction member 132 is formed of a rod-shaped member of a metal such as copper, a connection portion between the second heat conduction member 132 and the heat conducting pad 134 and a connection portion between the second heat conduction member 132 and the second wall 12f may be thermally and mechanically connected by using a bonding material such as solder. The heat transport efficiency through the second heat conduction member 132 can be improved by the mechanical connection. The shape of the second heat conduction member 132 may be a rectangular parallelepiped corresponding to the shapes of the heat conducting pads 134 and 134b, or may be a rectangular tube corresponding to the shape of the heat conducting pad 134a.

By the way, when the heat generated in the control unit 22 is transported to the second cover 12b through the second heat conduction member 132, if the second heat conduction member 132 comes into contact with the first substrate 14 and/or the second substrate 18, the heat that is being transported may be transported to the first substrate 14 and/or the second substrate 18. Therefore, in the present embodiment, a through-hole 136a that is sufficiently large so that the second heat conduction member 132 does not come into contact with the first substrate 14 when the second heat conduction member 132 penetrates through the first substrate 14 is formed in the first substrate 14. In the same manner, a through-hole 136b that is sufficiently large so that the second heat conduction member 132 does not come into contact with the second substrate 18 when the second heat conduction member 132 penetrates through the second substrate 18 is formed in the second substrate 18. When the second heat conduction member 132 is caused to penetrate through the first substrate 14 in this way, an air layer is formed between a wall of the through-hole 136a and an outer face (side face) of the second heat conduction member 132. Thereby, it is possible to reduce that the heat transported through the second heat conduction member 132 is transported to the first substrate 14. In the same manner, when the second heat conduction member 132 is caused to penetrate through the second substrate 18, an air layer is formed between a wall of the through hole 136b and an outer face (side face) of the second heat conduction member 132. Thereby, it is possible to reduce that the heat transported through the second heat conduction member 132 is transported to the second substrate 18. As a result, it is possible to reduce that the heat transported by the second heat conduction member 132 is transported to the storage unit 20 through the first substrate 14 and/or the second substrate 18 and the storage unit 20 is heated by the heat generated in the control unit 22.

As described above, according to the semiconductor memory device 130, the heat generated in the control unit 22 is transported to the first cover 12a and dissipated through the first heat conduction member 26 and is transported to the second cover 12b and dissipated through the second heat conduction member 132. As a result, the heat of the control unit 22 is efficiently dissipated and it is possible to reduce the degradation of function and the reduction of lifetime of the control unit 22 due to the heat. Further, the heat generated in the control unit 22 can be efficiently dissipated, so that the possibility that the heat generated in the control unit 22 is transported to the storage unit 20 is reduced and it is possible to reduce that the function of the storage unit 20 is degraded and the lifetime of the storage unit 20 is reduced due to the heat generated in the control unit 22.

In the case of FIG. 14, an example is illustrated in which the heat conducting pad 134 is formed on the fourth face 22h of the control unit 22 and is caused to come into contact with the second heat conduction member 132 that penetrates through the second substrate 18. In another embodiment, the heat conducting pad 134 is formed on the second face 18a of the second substrate 18 and the heat generated in the control unit 22 may be transported to the second cover 12b through the second heat conduction member 132 thermally connected (closely attached) to the heat conducting pad 134. In this case, in addition to the heat generated in the control unit 22, the heat that is generated in the storage unit 20 and is transported through the second substrate 18 can be transported to the second cover 12b by using the second heat conduction member 132. In other words, it is possible to improve the heat dissipation efficiency of the element 16 by transporting the heat generated in the entire element 16 to the second cover 12b.

Twelfth Embodiment

Figure 18:
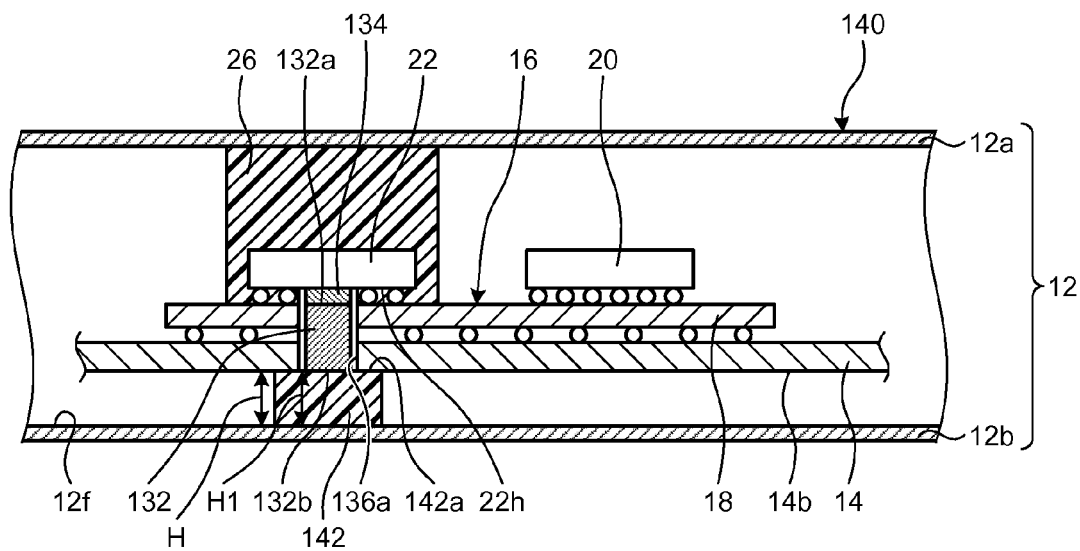
FIG. 18 is a cross-sectional view illustrating an example of a semiconductor memory device according to a twelfth embodiment.

FIG. 18 is a cross-sectional view illustrating an example of a semiconductor memory device 140 according to a twelfth embodiment. The semiconductor memory device 140 is a modified example of the semiconductor memory device 130 of the eleventh embodiment and the second heat conduction member 132 is thermally connected to the second wall 12f of the second cover 12b through a third heat conduction member 142. The other components are the same as those of the semiconductor memory device 130 of the eleventh embodiment, so that the detailed description thereof is omitted.

The tenth face 132a of the second heat conduction member 132 is thermally connected to the heat conducting pad 134 formed on the fourth face 22h of the control unit 22. The second heat conduction member 132 penetrates through the second substrate 18 and the first substrate 14, and the eleventh face 132b of the second heat conduction member 132 is exposed to the back face 14b of the first substrate 14. The eleventh face 132b may slightly protrude from the back face 14b. The third heat conduction member 142 is disposed in a state in which the third heat conduction member 142 is held between and compressed by the back face 14b of the first substrate 14 and the second wall 12f of the second cover 12b.

In the same manner as the first heat conduction member 26, the third heat conduction member 142 is formed into, for example, a block shape (rectangular parallelepiped, cube) by using, for example, a synthetic resin material (silicone rubber, elastomer, flexible resin). The third heat conduction member 142 includes a twelfth face 142a larger than the through-hole 136a so as to be in contact with the eleventh face 132b of the second heat conduction member 132 and the back face 14b. The thickness H1 of the third heat conduction member 142 is slightly greater than the distance H between the back face 14b and the second wall 12f, which is formed when the first substrate 14 is fixed to the second cover 12b by screws or the like (H1=H+β). As illustrated in FIG. 18, the first substrate 14 that supports the element 16 is fixed to the second cover 12b, so that the third heat conduction member 142 is pressed against the second wall 12f and compressed by the first substrate 14. In other words, the third heat conduction member 142 is deformed and closely attached to the second heat conduction member 132 and is also closely attached to the second wall 12f. As a result, the third heat conduction member 142 can efficiently transport the heat, which is generated in the control unit 22 and transported through the second heat conduction member 132, to the second cover 12b and dissipate the heat through the second cover 12b. The third heat conduction member 142 has flexibility, so that even when an external force is applied to the second cover 12b, the third heat conduction member 142 can absorb the external force. As a result, it is possible to reduce that an external force is applied to the second heat conduction member 132 and the control unit 22 from the second cover 12b. The third heat conduction member 142 may include a filler such as carbon to improve the heat conductivity.

As described above, according to the semiconductor memory device 140, the heat generated in the control unit 22 is transported to the first cover 12a and dissipated through the first heat conduction member 26 and is transported to the second cover 12b and dissipated through the second heat conduction member 132 and the third heat conduction member 142. As a result, the heat of the control unit 22 is efficiently dissipated and it is possible to reduce that the function of the control unit 22 is degraded and the lifetime of the control unit 22 is reduced due to the heat generated by the control unit 22. Further, the heat generated in the control unit 22 can be efficiently dissipated, so that the possibility that the heat generated in the control unit 22 is transported to the storage unit 20 is reduced and it is possible to reduce that the function of the storage unit 20 is degraded and the lifetime of the storage unit 20 is reduced due to the heat generated by the control unit 22.

Thirteenth Embodiment

Figure 19:
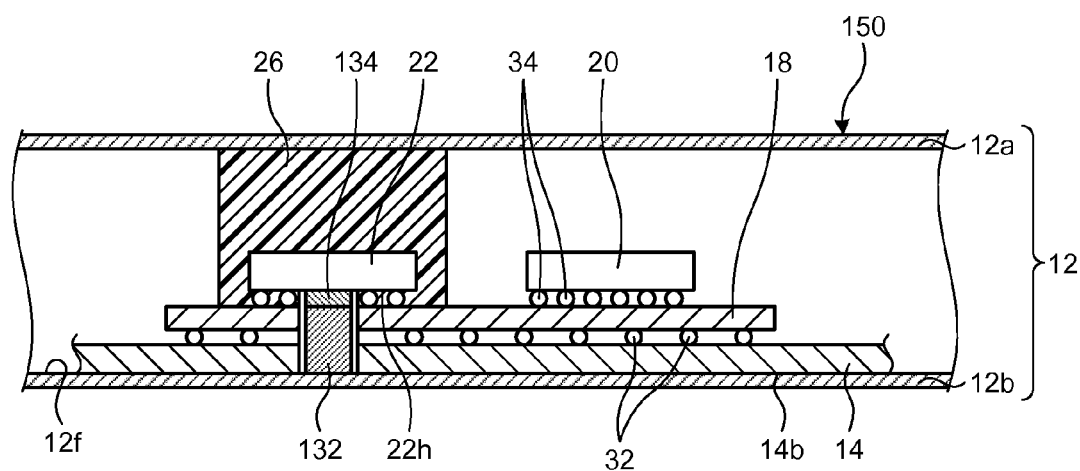
FIG. 19 is a cross-sectional view illustrating an example of a semiconductor memory device according to a thirteenth embodiment.

FIG. 19 is a cross-sectional view illustrating an example of a semiconductor memory device 150 according to a thirteenth embodiment. The semiconductor memory device 150 is a modified example of the semiconductor memory device 140 of the twelfth embodiment. For example, the configuration of the first heat conduction member 26 that covers the control unit 22, the heat conducting pad 134 formed on the fourth face 22h, and the second heat conduction member 132 connected to the heat conducting pad 134 is the same as that of the semiconductor memory device 140. As a result, the heat transport using the first heat conduction member 26 and the second heat conduction member 132 is performed in the same manner, and the heat generated in the control unit 22 is transported to the case 12 and dissipated.

In the case of the semiconductor memory device 150, the first substrate 14 that supports the element 16 is fixed to the second wall 12f of the second cover 12b in a state in which the first substrate 14 is in contact with the second wall 12f, and the first substrate 14 and the second cover 12b are thermally connected to each other. As described above, the heat generated in the control unit 22 is transported to the first cover 12a through the first heat conduction member 26 and is transported to the second cover 12b through the second heat conduction member 132. Further, the heat generated in the storage unit 20 is transported to the second substrate 18 through the bumps 34 and further transported to the first substrate 14 through the bumps 32. The first substrate 14 is in contact with the second wall 12f, so that the heat which is generated in the storage unit 20 and transported to the first substrate 14 is transported to the second cover 12b through the second wall 12f and dissipated from the second cover 12b.

As described above, according to the semiconductor memory device 150, the heat generated in the control unit 22 is transported to the first cover 12a and dissipated through the first heat conduction member 26 and is transported to the second cover 12b and dissipated through the second heat conduction member 132. As a result, the heat of the control unit 22 is efficiently dissipated and it is possible to reduce that the function of the control unit 22 is degraded and the lifetime of the control unit 22 is reduced due to the heat generated by the control unit 22. Further, the first substrate 14 is fixed to the second wall 12f in a state in which the first substrate 14 is in contact with the second wall 12f, so that it is possible to efficiently transport the heat generated in the storage unit 20 to the second cover 12b and dissipate the heat. As a result, it is possible to reduce that the function of the storage unit 20 is degraded and the lifetime of the storage unit 20 is reduced due to the heat generated by the storage unit 20.

Fourteenth Embodiment

Figure 20:
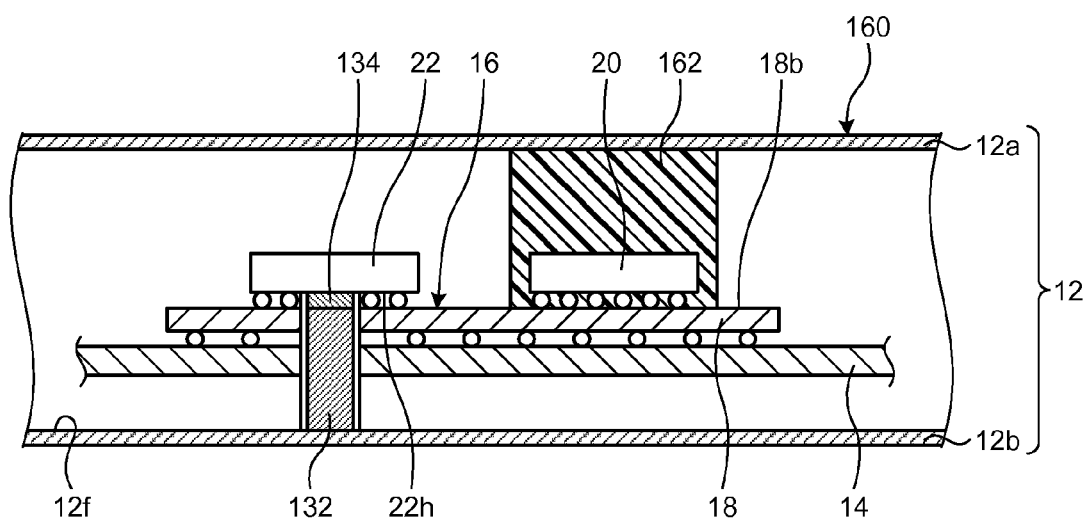
FIG. 20 is a cross-sectional view illustrating an example of a semiconductor memory device according to a fourteenth embodiment.

FIG. 20 is a cross-sectional view illustrating an example of a semiconductor memory device 160 according to a fourteenth embodiment. The semiconductor memory device 160 is a modified example of the semiconductor memory device 130 of the eleventh embodiment. The semiconductor memory device 160 omits the first heat conduction member 26 of the semiconductor memory device 130. Specifically, the semiconductor memory device 160 transports the heat generated in the control unit 22 to the second cover 12b through the second wall 12f by using the second heat conduction member 132 that is thermally connected to the control unit 22 through the heat conducting pad 134 formed on the fourth face 22h of the control unit 22. This configuration is effective when it is undesirable to transport the heat generated in the control unit 22 to the first cover 12a.

In the case of FIG. 20, a fourth heat conduction member 162 covers the storage unit 20. In the same manner as the first heat conduction member 26, the fourth heat conduction member 162 is formed into, for example, a block shape (rectangular parallelepiped, cube) by using, for example, a synthetic resin material (silicone rubber, elastomer, flexible resin). The fourth heat conduction member 162 is disposed between the storage unit 20 and the first cover 12a. When the first cover 12a and the second cover 12b are fastened together, the fourth heat conduction member 162 is pressed against the storage unit 20 by the first cover 12a and compressed. As a result, the fourth heat conduction member 162 is deformed and closely attached to the storage unit 20 and is also closely attached to the first cover 12a. As a result, the fourth heat conduction member 162 efficiently transports the heat generated in the storage unit 20 to the first cover 12a and dissipates the heat through the first cover 12a. The fourth heat conduction member 162 may include a filler such as carbon to improve the heat conductivity. The fourth heat conduction member 162 may include an electrically insulating magnetic material such as, for example, ferrite, which hardly allows radio waves to pass through in order to take countermeasures against radio wave interference. The fourth heat conduction member 162 itself may have adhesiveness. The fourth heat conduction member 162 can transport the heat generated in the storage unit 20 in the same manner as the first heat conduction member 26, and can obtain the same effect. For example, when the heat generated in the control unit 22 is desired to be dissipated from the second cover 12b and the heat generated in the control unit 22 is desired to be dissipated from the first cover 12a, that is, when the heat is desired to be dissipated in different ways, the configuration as described above is effective. The heat generated in the storage unit 20 where the fourth heat conduction member 162 is omitted may be transported to the second cover 12b through the first substrate 14 as described in the semiconductor memory device 150 or may be dissipated to the inside of the case 12 and air may be exhausted to the outside of the case 12 by using an air blowing device (fan) or the like.

Fifteenth Embodiment

Figure 21:
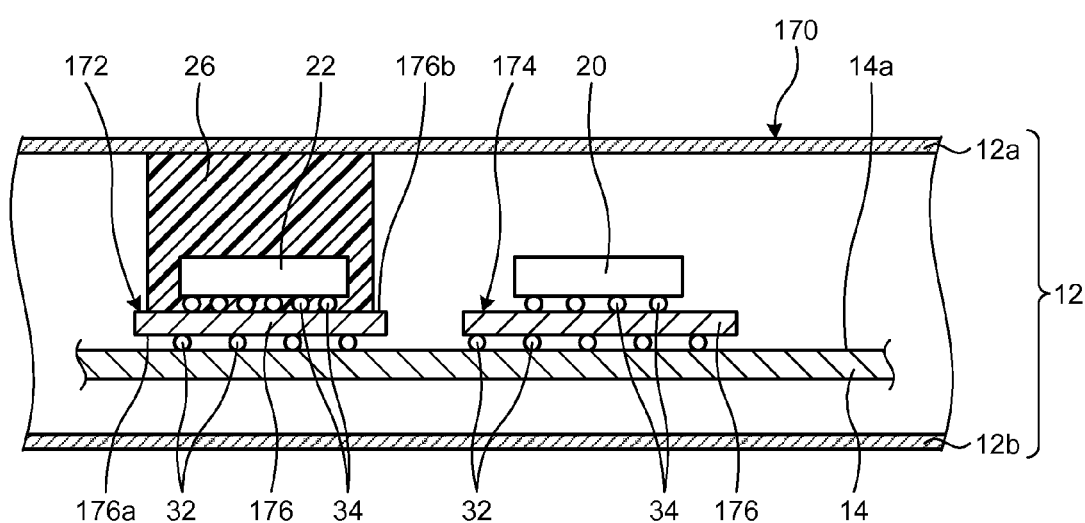
FIG. 21 is a cross-sectional view illustrating an example of a semiconductor memory device according to a fifteenth embodiment.

FIG. 21 is a cross-sectional view illustrating an example of a semiconductor memory device 170 according to a fifteenth embodiment. The semiconductor memory device 170 includes the case 12, the first substrate 14 which is provided in the case 12 and which includes the first face 14a, a control element 172 provided on the first face 14a, a storage element 174 provided on the first face, and the first heat conduction member 26 disposed at least between the control element 172 and the case 12. The control element 172 includes a second substrate 176 and the control unit 22. The second substrate 176 includes a second face 176a attached to the first face 14a and a third face 176b located opposite to the second face 176a. The control unit 22 is provided on the third face 176b. The first heat conduction member 26 covers the third face 176b and the control unit 22 and is disposed in a state in which the first heat conduction member 26 is held between and compressed by the third face 176b, the control unit 22, and the case 12.

In the case of the semiconductor memory device 170, the control element 172 is electrically connected and mechanically fixed to the first face 14a of the first substrate 14 through the bumps 32. The control unit 22 (bare chip) is flip-chip mounted on the third face 176b of the second substrate 176 included in the control element 172 through the bumps 34. The storage element 174 is electrically connected and mechanically fixed to the first face 14a of the first substrate 14 through the bumps 32. The storage unit 20 (bare chip) is flip-chip mounted on the third face 176b of the second substrate 176 included in the storage element 174 through the bumps 34.

Even when the control element 172 and the storage element 174 are separately fixed on the first face 14a as described above, as the frequency used by the control unit 22 increases, the amount of heat generation in the control unit 22 increases, and the control unit 22 and components around the control unit 22 may be heated. Therefore, it is possible to reduce the degradation of function and the reduction of lifetime of the control unit 22 and the storage unit 20 adjacent to the control unit 22 due to heat by effectively performing the heat dissipation of the control unit 22. Therefore, in the semiconductor memory device 170, the first heat conduction member 26 is provided to the control unit 22. The first heat conduction member 26 is formed of a material having flexibility (softness) in the same manner as in the other embodiments. The first heat conduction member 26 is formed into, for example, a block shape (rectangular parallelepiped, cube) by using, for example, a synthetic resin material (silicone rubber, elastomer, flexible resin). As illustrated in FIG. 21, the first heat conduction member 26 is disposed between the control unit 22 and the first cover 12a. When the first cover 12a and the second cover 12b are fastened together, the first heat conduction member 26 is pressed against the control unit 22 by the first cover 12a and compressed. As a result, the first heat conduction member 26 is deformed and closely attached to the control unit 22 and is also closely attached to the first cover 12a. Then, the first heat conduction member 26 can efficiently transport the heat generated in the control unit 22 to the first cover 12a and dissipate the heat through the first cover 12a.

A portion of the first heat conduction member 26 which is in contact with the control unit 22 is flat in the same manner as that of the first heat conduction member 26 of the first embodiment illustrated in FIG. 4. In this case, when the control unit 22 and the first heat conduction member 26 come into contact with each other, air is difficult to remain between the control unit 22 and the first heat conduction member 26. The first heat conduction member 26 is compressed in this state, so that air is more difficult to remain at the contact face than in a case in which the depressed portion is provided. As a result, it is reduced that the heat conductivity degrades when the first heat conduction member 26 comes into contact with the control unit 22. The first heat conduction member 26 may include a filler such as carbon to improve the heat conductivity. The first heat conduction member 26 may include a filler such as ferrite, for example, to take countermeasures against radio wave interference of the control unit 22. It is desired that the first heat conduction member 26 itself has adhesiveness to facilitate the operation to attach the first heat conduction member 26 to the semiconductor memory device 170. For example, when the first heat conduction member 26 is formed of silicon rubber or the like, it is possible to obtain necessary adhesive characteristics by changing a composition ratio between a silicon rubber component and a silicon resin component.

Even when the control element 172 and the storage element 174 are separately mounted on the first face 14a of the first substrate 14 as described above, the first heat conduction member 26 covers the third face 176b of the second substrate 176 and the control unit 22 of the control element 172. The first heat conduction member 26 is disposed in a state in which the first heat conduction member 26 is held between and compressed by the third face 176b, the control unit 22, and the first cover 12a (the case 12), so that it is possible to efficiently transport the heat generated in the control unit 22 to the first cover 12a and dissipate the heat from the first cover 12a. As a result, it is possible to reduce that the function of the control unit 22 is degraded and the lifetime of the control unit 22 is reduced due to the heat generated by the control unit 22. Further, the heat generated in the control unit 22 can be efficiently dissipated, so that it is possible to reduce the possibility that the heat generated in the control unit 22 is transported to the storage element 174 adjacent to the control element 172. As a result, it is possible to reduce that the function of the storage unit 20 is degraded and the lifetime of the storage unit 20 is reduced due to the heat generated by the control unit 22.

For the semiconductor memory device 170, an example is described in which the first heat conduction member 26 having the same shape as that of the first heat conduction member 26 described in the first embodiment is used. However, the first heat conduction member 42, 52, or 62 described in other embodiments may be used, and the effect according to the features of each heat conduction member can be obtained. Further, the second heat conduction member 132 or the third heat conduction member 142 described in the eleventh to the thirteenth embodiments may be used, and the effect according to the features of each heat conduction member can be obtained.

APPENDIX

Configuration 1 the semiconductor memory device according to configuration 1 includes, for example, the case, the first substrate provided in the case and including the first face, the element provided on the first face, and the first heat conduction member disposed between the element and the case. The element includes the second substrate, the control unit, and the storage unit. The second substrate includes a second face faced to the first face and a third face opposite to the second face. The control unit and the storage unit are provided on the third face, and the first heat conduction member covers the control unit and is disposed in a state in which the first heat conduction member is held between and compressed by the control unit and the case. According to this configuration, for example, it is possible to efficiently transport the heat generated in the control unit to the case through the first heat conduction member. Therefore, it is possible to reduce that the function of the control unit is degraded and the lifetime of the control unit is reduced due to the heat generated in the control unit.

Configuration 2

The semiconductor memory device according to configuration 1 is that, for example, the width of the first heat conduction member in the first direction along the first face at the first position in contact with the case may be greater than the width of the first heat conduction member in the first direction at the second position farther away from the case than the first position. According to this configuration, it is possible to increase the contact area, for example, between the first heat conduction member and the case. As a result, the heat generated in the control unit is diffused widely in the process in which the heat is transported in the first heat conduction member and the heat dissipation efficiency of the first heat conduction member can be improved by the heat diffusion. Therefore, it is possible to reduce that the function of the control unit is degraded and the lifetime of the control unit is reduced due to the heat generated in the control unit.

Configuration 3

The first heat conduction member of the semiconductor memory device according to configuration 1, for example, may cover the control unit and may be in contact with a part of the third face. According to this configuration, it is possible to transport, for example, the heat generated in the control unit to the case and also to transport a part of the heat generated in the control unit which is transported to the second substrate and a part of the heat which is further transported to the first substrate to the case through the first heat conduction member. As a result, it is possible to improve the heat dissipation efficiency of the semiconductor memory device.

Configuration 4

The first heat conduction member of the semiconductor memory device according to configuration 1 may be in contact with, for example, a part of the third face, a first width is greater than a second width, the first width representing a width of the first heat conduction member in a first direction along the first face at a first position in contact with the case, the second width representing a width of the first heat conduction member in the first direction at a second position farther away from the case than the first position. According to this configuration, for example, it is possible to increase the contact area between the first heat conduction member and the case, so that the heat generated in the control unit is diffused widely in a process in which the heat is transported in the first heat conduction member. By this heat diffusion, it is possible to improve the heat dissipation efficiency of the first heat conduction member. As a result, it is possible to reduce that the function of the control unit is degraded and the lifetime of the control unit is reduced due to the heat generated in the control unit. Further, a heat receiving portion of the case is reduced, so that it is possible to reduce that a part of the cover is excessively heated. Further, the possibility that the heat generated in the control unit is transported to the storage unit through the second substrate is reduced, so that it is possible to reduce that the function of the storage unit is degraded and the lifetime of the storage unit is reduced.

Configuration 5

The first heat conduction member of the semiconductor memory device according to configuration 1 may be disposed in a state in which, for example, the first heat conduction member covers the third face, the control unit, and the storage unit and is held between and compressed by the third face, the control unit, the storage unit, and the case. According to this configuration, for example, the first heat conduction member can transport both the heat generated in the control unit and the heat generated in the storage unit to the case. As a result, it is possible to improve the heat dissipation efficiency of the entire element (the entire semiconductor memory device). Therefore, it is possible to reduce that the function of the element is degraded and the lifetime of the element is reduced due to the heat generated in the element.

Configuration 6

The first heat conduction member of the semiconductor memory device according to configuration 1 may be disposed in a state in which, for example, the first heat conduction member covers the first face, the third face, and the control unit and is held between and compressed by the first face, the third face, the control unit, and the case. According to this configuration, it is possible to transport the heat generated in, for example, the control unit and the storage unit to the case. Further, it is possible to transport a part of the heat generated in the control unit and the storage unit which is transported to the second substrate and a part of the heat which is further transported to the first substrate to the case through the first heat conduction member. Thereby, it is possible to improve the heat dissipation efficiency of the semiconductor memory device. As a result, it is possible to reduce that the function of the element is degraded and the lifetime of the element is reduced due to the heat generated in the element.

Configuration 7

The first heat conduction member of the semiconductor memory device according to configuration 1 is that, for example, the dimension of the first heat conduction member of the semiconductor memory device in the thickness direction in a free state in which the first heat conduction member is not held between the third face, the control unit, and the case may be greater than the dimension of the first heat conduction member in the thickness direction when the first heat conduction member is held between the third face, the control unit, and the case. According to this configuration, for example, when the first heat conduction member is held between and compressed by the third face, the control unit, and the case, the faces of these are closely attached to each other and the heat can be efficiently transported.

Configuration 8

The first heat conduction member of the semiconductor memory device according to configuration 1 may have an adhesive force to attach to, for example, at least either the control unit or the case. According to this configuration, for example, when the first heat conduction member is held between the control unit and the case, the first heat conduction member can be temporarily attached to the case or the like, so that it is possible to contribute to improving the assembly workability. Further, when the first heat conduction member is temporarily attached, it is not necessary to separately dispose another member such as an adhesive. Therefore, it is reduced that an unnecessary layer is formed in the heat transport path and it can be reduced that the heat conductivity degrades.

Configuration 9

The first heat conduction member of the semiconductor memory device according to configuration 1 may include an electrically insulating magnetic material. According to this configuration, it is possible to take countermeasures against radio wave interference of the control unit, so that the operation of the control unit can be more stabilized.

Configuration 10

The element of the semiconductor memory device according to configuration 1 may be, for example, thermally connected to the case through the second heat conduction member, the case may include the first wall in contact with the first heat conduction member and the second wall located opposite to the first wall with respect to the first substrate, and the second heat conduction member may penetrate through the first substrate. According to this configuration, for example, it is possible to transport the heat generated in the control unit to the case through the second wall by using the second heat conduction member. As a result, the heat of the control unit is efficiently dissipated and it is possible to reduce that the function of the control unit is degraded and the lifetime of the control unit is reduced due to the heat generated by the control unit.

Configuration 11

The second heat conduction member of the semiconductor memory device according to configuration 10 may penetrate through the first substrate in a state in which, for example, the second heat conduction member is not in contact with the first substrate. According to this configuration, when the heat generated in the control unit is transported by the second heat conduction member that penetrates through the first substrate, it is reduced that the heat is transported to the first substrate. As a result, it is reduced that the heat generated in the control unit is transported to the storage unit through the first substrate. Therefore, it is possible to reduce that the function of the storage unit is degraded and the lifetime of the storage unit is reduced due to the heat generated by the control unit.

Configuration 12

The second heat conduction member of the semiconductor memory device according to configuration 10 is that, for example, the dimension of the second heat conduction member of the semiconductor memory device in the thickness direction in a free state in which the second heat conduction member is not held between the element and the case may be greater than the dimension of the second heat conduction member in the thickness direction when the second heat conduction member is held between the element and the case. According to this configuration, for example, when the second heat conduction member is held between and compressed by the control unit and the case, the faces of these are closely attached to each other and the heat can be efficiently transported.

Configuration 13

The second heat conduction member of the semiconductor memory device according to configuration 10 may have an adhesive force to attach to, for example, at least either one of the element and the case. According to this configuration, for example, when the second heat conduction member is held between the control unit and the case, the second heat conduction member can be temporarily attached to the case or the like, so that it is possible to contribute to improving the assembly workability. Further, when the second heat conduction member is temporarily attached, it is not necessary to separately dispose another member such as an adhesive. Therefore, it is reduced that an unnecessary layer is formed in the heat transport path and it can be reduced that the heat conductivity degrades.

Configuration 14

The second heat conduction member of the semiconductor memory device according to configuration 10 may be metal. According to this configuration, it is possible to efficiently transport the heat generated in the control unit to the case through the second heat conduction member.

Configuration 15

The semiconductor memory device according to configuration 15 includes, for example, the case, the first substrate which is provided in the case and which includes the first face, a first element provided on the first face, and the first heat conduction member disposed between the first element and the case. The first element includes the control unit. The first heat conduction member covers the control unit and is disposed in a state in which the first heat conduction member is held between and compressed by the control unit and the case. According to this configuration, for example, it is possible to efficiently transport the heat generated in the control unit to the case through the first heat conduction member. Therefore, it is possible to reduce that the function of the control unit is degraded and the lifetime of the control unit is reduced due to the heat generated in the control unit.

What is claimed is:

1. A semiconductor memory device comprising:
    a case;
    a first substrate provided in the case and including a first face;
    an element provided on the first face; and
    a first heat conduction member disposed between the element and the case,
    wherein the element includes a second substrate, a control unit, and a storage unit,
    the second substrate includes a second face attached to the first face and a third face opposite to the second face,
    the control unit and the storage unit are provided on the third face,
    the first heat conduction member covers the control unit and is disposed in a state in which the first heat conduction member is held between and compressed by the control unit and the case,
    the first heat conduction member is in contact with a part of the third face, and
    a first width is greater than a second width, the first width representing a width of the first heat conduction member in a first direction along the first face at a first position in contact with the case, the second width representing a width of the first heat conduction member in the first direction at a second position farther away from the case than the first position.

2. The semiconductor memory device according to claim 1, wherein the first heat conduction member covers the third face, the control unit, and the storage unit and is disposed in a state in which the first heat conduction member is held between and compressed by the third face, the control unit, the storage unit, and the case.

3. The semiconductor memory device according to claim 1, wherein the first heat conduction member covers the first face, the third face, and the control unit and is disposed in a state in which the first heat conduction member is held between and compressed by the first face, the third face, the control unit, and the case.

4. The semiconductor memory device according to claim 1, wherein
    a dimension of the first heat conduction member in a thickness direction, while being placed in a free state, is greater than the dimension while being held among the third face, the control unit, and the case.

5. The semiconductor memory device according to claim 1, wherein the first heat conduction member has an adhesive force to attach to at least either the control unit or the case.

6. The semiconductor memory device according to claim 1, wherein the first heat conduction member includes an electrically insulating magnetic material.

7. The semiconductor memory device according to claim 1, wherein
    the element is thermally connected to the case through a second heat conduction member,
    the case includes a first wall and a second wall, the first wall being in contact with the first heat conduction member, the second wall being located opposite to the first wall with respect to the first substrate, and
    the second heat conduction member penetrates through the first substrate.

8. The semiconductor memory device according to claim 7, wherein the second heat conduction member penetrates through the first substrate in a state in which the second heat conduction member is not in contact with the first substrate.

9. The semiconductor memory device according to claim 7, wherein a dimension of the second heat conduction member in a thickness direction, while being placed in a free state, is greater than the dimension while being held among the element and the case.

10. The semiconductor memory device according to claim 7, wherein the second heat conduction member has an adhesive force to attach to at least either one of the element and the case.

11. The semiconductor memory device according to claim 7, wherein the second heat conduction member is metal.

12. A semiconductor memory device comprising:
    a case;
    a first substrate which is provided in the case and which includes a first face;
    a first element provided on the first face; and
    a first heat conduction member disposed between the first element and the case,
    wherein the first element includes a control unit, and
    the second substrate includes a second face attached to the first face and a third face opposite to the second face,
    the control unit is provided on the third face of the second substrate;
    the first heat conduction member covers the control unit and is disposed in a state in which the first heat conduction member is held among the third face, the control unit, and the case and is in thermally close contact with the third face, the control unit, and the case,
    the first heat conduction member is in contact with a part of the third face, and
    a first width is greater than a second width, the first width representing a width of the first heat conduction member in a first direction along the first face at a first position in contact with the case, the second width representing a width of the first heat conduction member in the first direction at a second position farther away from the case than the first position.

* * * * *